United States Patent
Lee et al.

(10) Patent No.: US 8,314,542 B2
(45) Date of Patent: Nov. 20, 2012

(54) ORGANIC ELECTROLUMINESCENCE DEVICE

(75) Inventors: Jeong Ik Lee, Gyeonggi-do (KR); Hye Yong Chu, Daejeon (KR); Doo-Hee Cho, Daejeon (KR); Jun-Han Han, Daejeon (KR); Jin Wook Shin, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 50 days.

(21) Appl. No.: 13/019,302

(22) Filed: Feb. 1, 2011

(65) Prior Publication Data

US 2012/0049723 A1  Mar. 1, 2012

(30) Foreign Application Priority Data

Aug. 26, 2010  (KR) .......................... 10-2010-083058

(51) Int. Cl.
*H01L 51/50* (2006.01)
*H01L 51/52* (2006.01)

(52) U.S. Cl. ......... 313/501; 313/512; 313/503; 313/506

(58) Field of Classification Search ........... 313/500–512
See application file for complete search history.

(56) References Cited

U.S. PATENT DOCUMENTS

| | | | |
|---|---|---|---|
| 7,106,001 B2 * | 9/2006 | Kim et al. ..................... 313/512 |
| 7,273,663 B2 | 9/2007 | Liao et al. | |
| 7,622,861 B2 * | 11/2009 | Oooka et al. ................. 313/504 |
| 7,768,196 B2 | 8/2010 | Kobayashi | |
| 2004/0105047 A1 * | 6/2004 | Kato ............................... 349/69 |
| 2005/0260451 A1 * | 11/2005 | Kijima .......................... 428/690 |
| 2006/0006792 A1 * | 1/2006 | Strip ............................. 313/500 |
| 2007/0080629 A1 * | 4/2007 | Ko ................................ 313/504 |
| 2008/0278066 A1 | 11/2008 | Spindler et al. | |
| 2012/0081892 A1 * | 4/2012 | Kubota ......................... 362/231 |

FOREIGN PATENT DOCUMENTS

| | | |
|---|---|---|
| JP | 2005-079014 A | 3/2005 |
| JP | 2005-116516 A | 4/2005 |
| JP | 2005-197011 A | 7/2005 |
| KR | 10-0567179 A | 3/2006 |
| KR | 10-0628150 A | 9/2006 |
| KR | 2007-0058765 A | 6/2007 |
| KR | 10-0740793 B1 | 7/2007 |
| KR | 10-0875097 | 12/2008 |

* cited by examiner

*Primary Examiner* — Mariceli Santiago
(74) *Attorney, Agent, or Firm* — Rabin & Berdo, P.C.

(57) ABSTRACT

Provided is an organic electroluminescence device. The organic electroluminescence device includes: a first device including a first substrate, a first electrode, a first organic light emitting layer and a second electrode, the first electrode, the first organic light emitting layer and the second electrode being sequentially stacked on the first substrate; a second device facing the first device and including a second substrate, a third electrode, a second organic light emitting layer and a fourth electrode, the third electrode, the second organic light emitting layer and the fourth electrode being sequentially stacked on the second substrate; and a bonding layer bonding the first device with the second device, wherein one of lights emitted from the first and second organic light emitting layers resonates in one of the first device or the second device.

19 Claims, 24 Drawing Sheets

«ORGANIC ELECTROLUMINESCENCE DEVICE

CROSS-REFERENCE TO RELATED APPLICATIONS

This U.S. non-provisional patent application claims priority under 35 U.S.C. §119 of Korean Patent Application No. 10-2010-0083058, filed on Aug. 26, 2010, the entire contents of which are hereby incorporated by reference.

BACKGROUND OF THE INVENTION

The present invention disclosed herein relates to an organic electroluminescence device, and more particularly, to an organic electroluminescence device using optical resonance.

An organic electroluminescence device is a self luminous type display device electrically exciting an organic compound to emit light. The organic electroluminescence device may be driven by low voltage and has high luminance, a wide viewing angle, and a fast response speed such that it receives great attention as the next generation display.

The organic electroluminescence device includes a cathode, an anode, and an organic light emitting layer between the cathode and the anode. Electrons from the cathode and electron holes from the anode are bonded in the organic light emitting layer, thereby forming excitons. The excitons emit light as shifting from an excited state into a ground state. The organic electroluminescence device may emit diverse colors according to kinds of organic compounds. The organic electroluminescence device may display various colors using organic light emitting layers that emit respectively different colors.

SUMMARY OF THE INVENTION

The present invention provides a white-color organic electroluminescence device with a high external quantum efficiency and high luminance stability by adopting a cavity structure to one of respectively-bonded two devices.

The present invention also provides an organic electroluminescence device easily adjusting emitted colors.

Embodiments of the present invention provide organic electroluminescence devices including: a first device including a first substrate, a first electrode, a first organic light emitting layer and a second electrode, the first electrode, the first organic light emitting layer and the second electrode being sequentially stacked on the first substrate; a second device facing the first device and including a second substrate, a third electrode, a second organic light emitting layer and a fourth electrode, the third electrode, the second organic light emitting layer and the fourth electrode being sequentially stacked on the second substrate; and a bonding layer bonding the first device with the second device, wherein one of lights emitted from the first and second organic light emitting layers resonates in one of the first device or the second device.

In some embodiments, the second electrode may face the fourth electrode.

In other embodiments, one of the electrodes in one of the devices may be a reflex mirror layer and the other may be a semi-transmission mirror layer; and the reflex mirror layer may be the first electrode and the semi-transmission layer may be the second electrode.

In still other embodiments, the second electrode may be a semi-transmission mirror layer and a dielectric mirror as a reflex mirror layer may be further included between the first substrate and the first electrode, or the first electrode may be a reflex mirror layer and a dielectric mirror as a semi-transmission mirror layer may be further included on the top of the second electrode.

In even other embodiments, the electrodes in one of the devices may be semi-transmission mirror layers.

In yet other embodiments, one of the third electrode or the fourth electrode may be a semi-transmission mirror layer and a dielectric mirror as a semi-transmission mirror layer may be further included on the top of the fourth electrode or between the second substrate and the third electrode.

In further embodiments, the second electrode may face the second substrate.

In still further embodiments, one of the electrodes in one of the devices may be a reflex mirror layer and the other may be a semi-transmission mirror layer; and the reflex mirror layer may be the first electrode and the semi-transmission mirror layer may be the second electrode.

In even further embodiments, one of the electrodes in one of the devices may be a reflex mirror layer and the other may be a semi-transmission mirror layer; and the reflex mirror layer may be the fourth electrode and the semi-transmission mirror layer may be the third electrode.

In yet further embodiments, the electrodes in one of the devices may be semi-transmission mirror layers.

In yet further embodiments, one of the second electrode or the third electrode may be a semi-transmission mirror layer; and a dielectric mirror as a reflex mirror layer may be further included between the first substrate and the first electrode or on the top of the fourth electrode in the device including the second electrode or the third electrode.

In yet further embodiments, one of the first electrode or the fourth electrode may be a reflex mirror layer; and a dielectric mirror as a semi-transmission mirror layer may be further included on the top of the second electrode or between the second substrate and the third electrode in the device including the first electrode or the fourth electrode.

In yet further embodiments, one of the first electrode, the second electrode, the third electrode or the fourth electrode may be a semi-transmission mirror layer, and a dielectric mirror as a semi-transmission mirror layer may be further included on the top of the second electrode, between the first substrate and the first electrode, on the top of the fourth electrode, or between the second substrate and the third electrode in the device including the first electrode, the second electrode, the third electrode, or the fourth electrode.

In yet further embodiments, a first light emitted from the first organic light emitting layer and a second light emitted from the second organic light may be in a complementary color relationship.

In yet further embodiments, the first light and the second light may be one of azure color light, red color light, blue color light, or orange color light.

In yet further embodiments, an optical distance between the electrodes in one of the devices may be an integer times of a half-wavelength of one of the azure color light, the red color light, the blue color light, or the orange color light.

In yet further embodiments, an optical distance between the dielectric mirror and an electrode provided as one of the reflex mirror layer or the semi-transmission mirror layer in the device including the dielectric mirror may be an integer times of a half-wavelength of one of lights emitted from the first and second organic light emitting layers.

In yet further embodiments, a first light emitted from the first organic light emitting layer and a second light emitted from the second organic light emitting layer may be in a complementary color relationship.

In yet further embodiments, the first light and the second light may be one of azure color light, red color light, blue color light, or orange color light.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
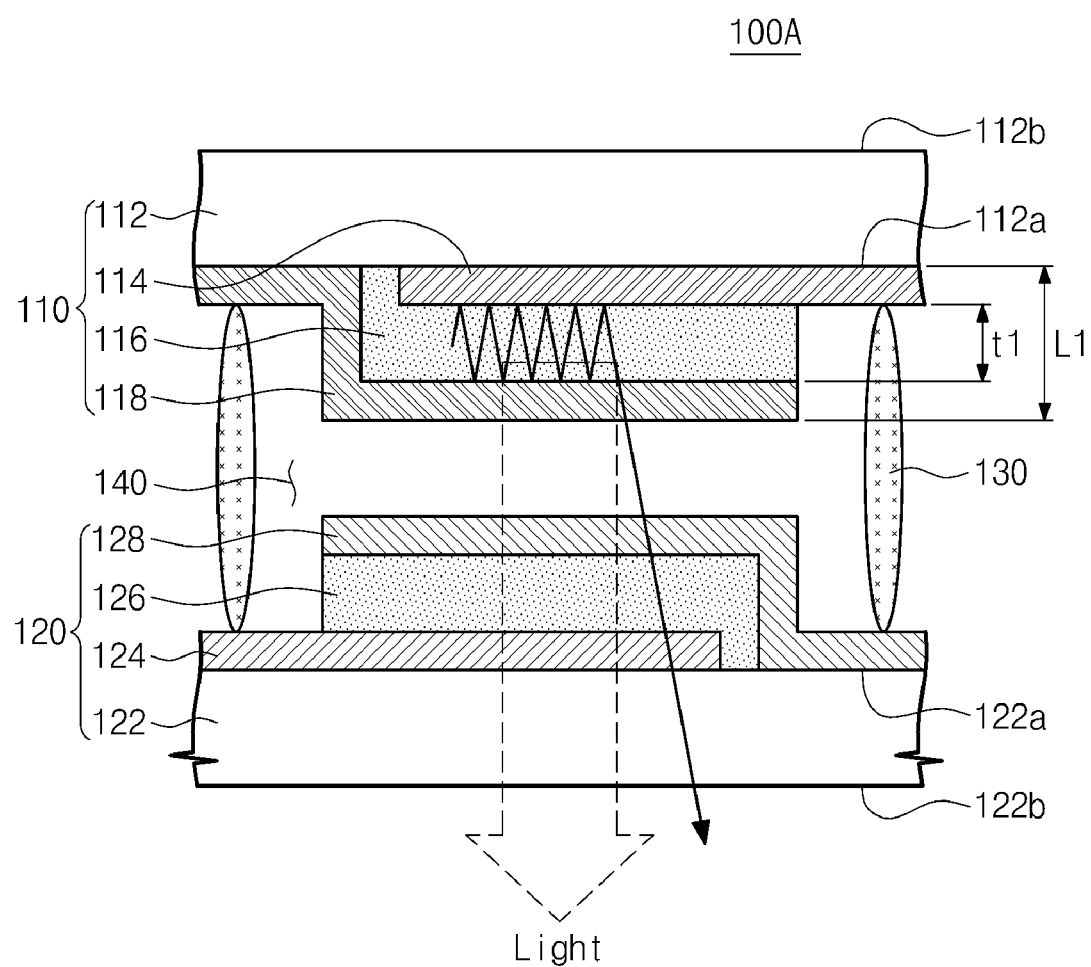
FIGS. 1 through 18 are sectional views illustrating an organic electroluminescence device according to first to eighteenth embodiments.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

FIGS. 1 through 18 are sectional views illustrating an organic electroluminescence device according to first to eighteenth embodiments. Here, throughout the embodiments, like reference numerals refer to like elements.

Hereinafter, the first embodiment will be described with reference to FIG. 1. An organic electroluminescence device 100A according to the first embodiment of the present invention includes a first device 110, a second device 120 facing the first device 110, and a bonding layer 130 bonding the first device 110 with the second device 120.

The first device 110 may include a first substrate 112 having first and second surfaces 112a and 112b facing each other, and a first electrode 114, a first organic light emitting layer 116, and a second electrode 118, which are sequentially stacked on the first surface 112a of the first substrate 112. The first substrate 112 may include a transparent or opaque insulation material. For example, the first substrate 112 may include glass, plastic, or quartz.

The first electrode 114 is provided as a reflex mirror. The reflex mirror is a reflective layer reflecting lights that progress toward the reflex mirror. The first electrode 114 may be formed of a double layer or a triple layer including a thick metal layer on, below, or in a transparent electrode to allow reflection. Here, the transparent electrode may include indium tin oxide (ITO) or indium zinc oxide (IZO), and the metal layer may include Ag of high reflectance.

The second electrode 118 is a semi-transmission layer provided as a half mirror to reflect and transmit and reflect a part of light. Since a thin metal may transmit and reflect light partially, the second electrode 118 may include a metal having a thickness of less than about 25 nm. Here, the metal is not limited to any metal only if it reflects some light and transmits some light and thus, may include Ag, Al, Mg, Mo, or an alloy thereof. At this point, the first electrode 114 may achieve optical resonance effect through reflection characteristic due to the second electrode 118.

In relation to the first electrode 114 and the second electrode 118, one formed of a material with low work function among them may become a cathode providing electrons and the other may become an anode providing holes. For example, the first electrode 114 formed of the reflex mirror layer may become an anode and the second electrode 118 formed of the semi-transmission mirror layer may become a cathode.

In addition, the first electrode 114 and the second electrode 118 are not limited to the anode and the cathode, respectively, and it is apparent that the first electrode 114 may be the cathode and the second electrode 118 may be the anode.

The first organic light emitting layer 116 may include an organic light emitting material emitting a first light of azure color, red color, blue color, or orange color. The organic light emitting material may include polyfluorene derivative, anthracene derivative, distyrylarylene derivative, or rubrene derivative. By using the organic light emitting materials as a host material and doping a dopant into the host material, light emitting efficiency may be improved. The dopant may include xanthenes, perylene, cumarine, rhodamine, rubrene, thiopyran, Nile red, carbostyryl, dicyanomethylenepyran, (thia)pyrilium, periflanthene derivative, indenoperylene derivative, or quinacridone.

The first organic light emitting layer 116 may be formed of a single layer including the organic light emitting material and may additionally include an auxiliary layer to improve light emitting efficiency. The auxiliary layer may include a hole injecting layer, a hole transfer layer, an electron transfer layer, or an electron injecting layer.

If the first electrode 114 is used as an anode and the second electrode 118 is used as a cathode, the hole transfer layer and the hole injecting layer may be formed of a material having the highest occupied molecular orbital (HOMO) level between a work function of the first electrode 114 and the HOMO level of the organic light emitting material. The electron transfer layer and the electron injecting layer may be formed of a material having the lowest unoccupied molecular orbital (LUMO) level between a work function of the second electrode 118 and the LUMO level of the organic light emitting material.

The hole transfer layer or the hole injecting layer may include diamines, MTDATA([4,4',4"-tris(3-methylphenylphenylamino)triphenylamine]), TPD(N,N'-diphenyl-N,N'-di(3-methylphenyl)-1,1'-byphenyl-4,4'-diamine)), 1,1-bis(4-dip-tolylaminophenyl)cyclohexane), 1,1-bis(4-dip-tolylaminophenyl)cyclohexane), N,N,N',N'-tetra(2-naphthyl)-4,4-diamino-p-terphenyl, polypyrrole, polyaniline, or poly-(3,4-ethylenedioxythiophene:polystyrenesulfonate) (PEDOT:PSS). A material used as the electron injecting layer may include alkaline metal, alkaline earth metal, or an oxide thereof. A material used as the electron transfer layer may include tris(8-hydroxyquinolinato) aluminium derivative, o-, m-, or p-phenanathroline derivative, oxadiazole derivative, or triazole derivative.

The first device 110 having the above structure corresponds to a front light emitting type that the first light emitted from the first organic light emitting layer 116 is extracted to the top of the second electrode 118 and has a cavity structure L1 including the first electrode 114, the first organic light emitting layer 116, and the second electrode 118. For convenience of description, optical path is shown in a slope direction and a change of an incident angle due to refraction is omitted in FIG. 1. Hereinafter, optical paths in other drawings are shown in a similar manner. However, an actual light path may progress in a different direction that that.

A geometric distance t1 between the first electrode 114 and the second electrode 118 may be adjusted according to an optical distance that an optical resonance may occur. An optical distance from the first electrode 114 to the second electrode 118 is equal to the sum of optical thicknesses of layers interposed between the first electrode 114 and the second electrode 118. Each of optical distances of the layers corresponds to a result of a refractive index times a geometric thickness of each layers. If a wavelength of a specific light that resonance occurs between the first electrode 114 and the second electrode 118 is λ, the optical distance may be an integer times of λ/2. If a relationship between the peak wavelength and the optical distance is expressed as the following Equation 1. Here, n is a refractive index of each layer, d is a geometric thickness of each layer, and m is a positive integer.

$$\sum (n \times d) = m \times \frac{\lambda}{2} \qquad \text{[Equation 1]}$$

The geometric distance t1 is obtained with the sum of geometric thicknesses of each of layers using Equation 2.

$$\tau d = t1 \qquad \text{[Equation 2]}$$

By calculating the geometric distance t1 using Equations 1 and 2, the first light of a specific wavelength may be enhanced. For example, if the light emitted from the first organic light emitting layer 116 is one of azure color, red color, blue color, and orange color, the geometric distance t1 between the first electrode 114 and the second electrode 118 may be obtained by selecting a wavelength of light to be enhanced from azure color, red color, blue color, red color, and orange color. Here, the optical distance between the first electrode 114 and the second electrode 118 may be easily adjusted by adjusting a thickness of the first organic light emitting layer 116.

Although it is described with reference to FIG. 1 that resonance occurs between the first electrode 114 and the second electrode 118, if the first electrode 114 is formed of ITO/Ag/ITO, reflection of the first light emitted from the first organic light emitting layer 116 progresses in metal layer, i.e., an interface of Ag, of the first electrode 114. Moreover, an optical distance that resonance occurs between the second electrode 118 and the Ag interface of the first electrode 114 is equal to the sum total of the sum of optical thicknesses of layers interposed in the first organic light emitting layer 116 and an optical thickness of a corresponding transparent electrode in the first electrode 114. At this point, if a peak wavelength of a specific light that resonance occurs is λ, an optical distance may be an integer times of λ/2.

The second device 120 is spaced apart from and faces the first device 110. The second device 120 may include a second substrate 122 having first and second surfaces 122a and 122b facing each other, and a third electrode 124, a second organic light emitting layer 125, and a fourth electrode 128, which are sequentially stacked on the first surface 122a of the second substrate 122. For example, the second substrate 122 may include glass, plastic, or quartz.

The third and fourth electrodes 124 and 128 may include a transmission electrode. For example, the third and fourth electrodes 124 and 128 may include a transparent electrode (such as ITO or IZO), Ag, Al, Mg, Mo, or an alloy thereof.

In relation to the third electrode 124 and the fourth electrode 128, among them, an electrode formed of a material with low work function may become a cathode providing electrons and an electrode formed of a material with high work function may become an anode providing holes. For example, the third electrode 124 may become an anode and the fourth electrode 128 may become a cathode, and also the third electrode 124 may become a cathode and the fourth electrode 128 may become an anode.

The second organic light emitting layer 126 may include an organic light emitting material emitting a second light, which has a complementary relationship with respect to the first light emitted from the first organic light emitting layer 116 of the first device 110. The second light of the second organic light emitting layer 126 may be one of azure color, red color, blue color, or orange color. Here, azure color and red color or blue color and orange color correspond to a complementary relationship, and through combination of the complementary relationship, white light may be emitted finally from the organic electroluminescence device 100A.

Except that the second organic light emitting layer 126 includes an organic light emitting material emitting the second light that has a complementary relationship with respect to the first light emitted from the first organic light emitting layer 116, the second organic light emitting layer 125 has the same configuration as the first organic light emitting layer 115. Therefore, its description will be omitted.

The second device 120 having the above structure corresponds to a both sides light emitting type that the second light emitted from the second organic light emitting layer 126 is extracted in the front and rear directions of the second substrate 122.

The bonding layer 130 bands the first surface 112a of the first substrate 122 and the first surface 122a of the second substrate 122 to face each other. That is, by the bonding layer 130, the second electrode 118 of the first device 110 faces the fourth electrode 128 of the second device 120. The bonding layer 130 may include a pressure-sensitive adhesive or a bonding adhesive having a higher refractive index than the first and second substrates 112 and 122 in order to improve external quantum efficiency of the organic electroluminescence device 100A. A fluorescent substance may be included in the pressure-sensitive adhesive or the bonding adhesive to improve color rendering index or color gamut. For example, if the bonding layer 130 is bonded to a portion of the first electrode 114 and a portion of the third electrode 124, an air layer 140 is formed between the first device 110 and the second device 120.

Although not shown, the organic electroluminescence device 100A may further include a light extraction film inserted between the second substrate 122 and the third electrode 124 or between the first device 110 and the second device 120, in order to improve light extraction efficiency.

Thereby, the first device 110 of a front light emitting type and the second device 120 of a both sides light emitting type are bonded to form the organic electroluminescence 110A, and the second side 122b of the second substrate 122 becomes a light emission side.

In more detail, the first light emitted from the first organic light emitting layer 116 of the first device 110 may resonate between the first electrode 114 of a reflex mirror and the second electrode 118 of a semi-transmission mirror. The resonance occurs at the geometric distance t1 from the first electrode 114 to the second electrode 118.

For example, a part of the first light emitted from the first organic light emitting layer 116 is partially transmitted through and reflected by the second electrode 118. The first light reflected by the second electrode is reflected by the first electrode 114 and progresses toward the bottom direction again, and then is partially transmitted through and reflected by the second electrode 118. Accordingly, constructive interference of the first light occurs, and as a result, the light of an enhanced specific wavelength may be obtained.

Unlike this, the second light emitted from the second organic light emitting layer 126 of the second device 120 is partially transmitted through the third electrode 124 and is also partially transmitted through the fourth electrode 128. The second light partially transmitted through the fourth electrode 128 is transmitted through the second electrode 118, and may resonate between the first electrode 114 and the second electrode 118. In relation to the resonance, a part of the second light emitted from the second organic light emitting layer 126, which progresses toward the top direction and is transmitted through the second electrode 118, is reflected by the first electrode 114 and progresses in the bottom direction again, and then is partially transmitted through and reflected by the second electrode 118. Accordingly, constructive interference of the second light emitted from the second organic light emitting layer 126 occurs, as a result, the light of an enhanced specific wavelength may be obtained.

When voltages are applied to the first and second electrode 114 and 118 and the third and fourth electrodes 124 and 128 of the organic electroluminescence device 100A, the first organic light emitting layer 116 emits the first light and the second organic light emitting layer 126 emits the second light.

The first and second lights emitted from the first and second organic light emitting layers 116 and 126 are extracted to the external through the second side 122b of the second substrate 122. As a result, the light emitted from the organic electroluminescence device 100A emits white light finally by complementary color combination of the first light emitted from the first organic light emitting layer 116 and the second light emitted from the second organic light emitting layer 126.

According to the first embodiment of the present invention, the organic electroluminescence 110A in which the first device 110 of a front light emitting type and the second device 120 of a both sides light emitting type are bonded is provided, and a cavity structure is formed in the first device 110 of the front light emitting type far from the light emission side 122b. As a result, the organic electroluminescent device 100A may obtain white light with improved external quantum efficiency using resonance of light in the first device 110. Additionally, since luminance is adjusted using resonance of light, light color is easily adjusted and it is possible to manufacture a stable high-luminance light emitting device.

Figure 2:
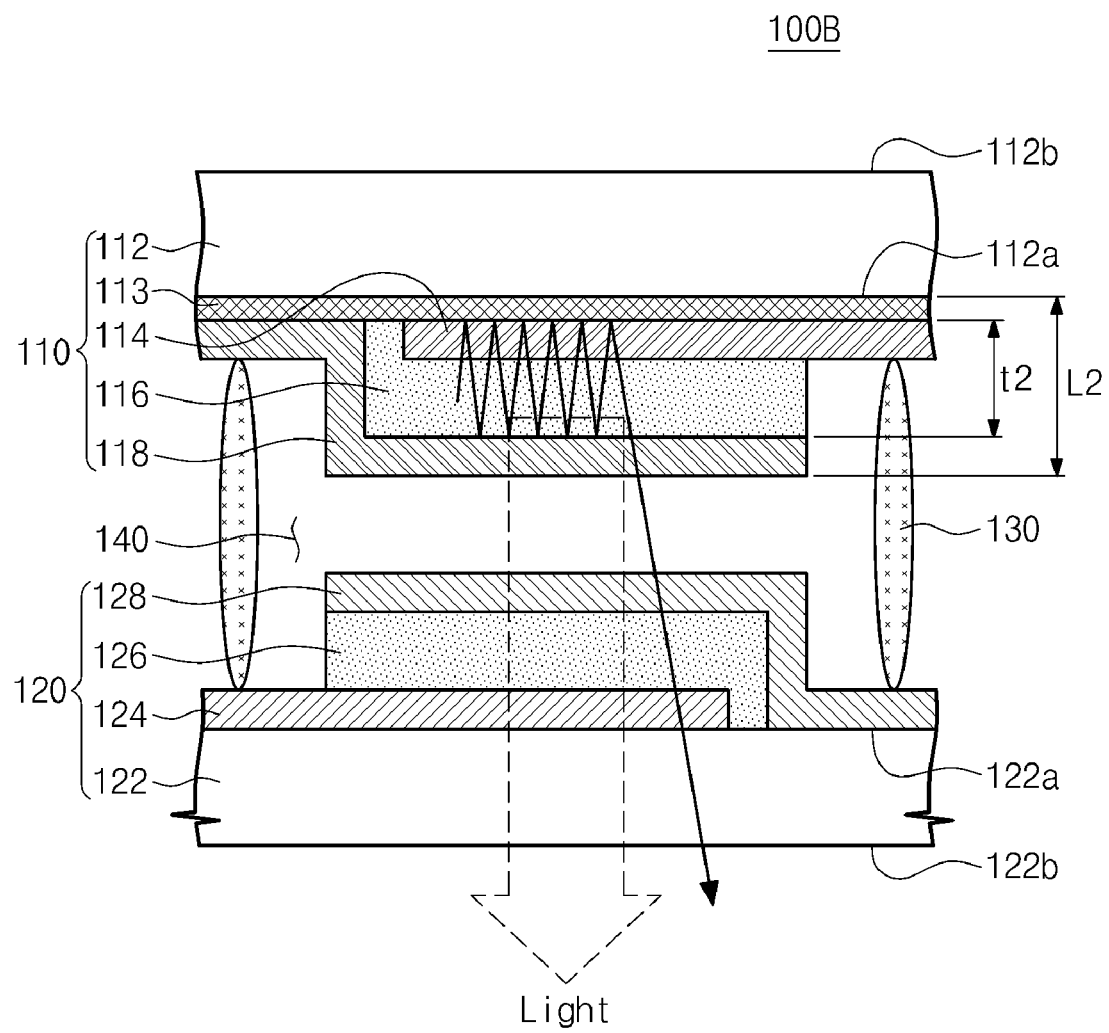

Hereinafter, referring to FIG. 2, the second embodiment of the present invention will be described. Except that an organic electroluminescence device 100B according to the second embodiment of the present invention further includes a dielectric mirror 113 provided as a reflex mirror between the first substrate 112 and the first electrode 114 of the first device 110 and the first electrode 114 is formed of a transmission electrode, the remaining components are identical to those of the first embodiment. Accordingly, overlapping description will be omitted and only differences will be described.

The first device 110 may include a first substrate 112 having first and second surfaces 112a and 112b facing each other, and the dielectric mirror 113, the first electrode 114, the first organic light emitting layer 116, and the second electrode 118, which are sequentially stacked on the first surface 112a of the first substrate 112.

The dielectric mirror 113 is a reflective layer provided as a reflex mirror, where a low refractive index material and a high refractive index material are stacked alternately. The first electrode 114 may include a transmission electrode. For example, the first electrode 114 may include ITO or IZO. The first device 110 may have a cavity structure L2 including the dielectric mirror (as a reflex mirror) 113, the first electrode 114, the first organic light emitting layer 116, and the second electrode (as a semi-transmission mirror) 118.

One of the first and second lights emitted from the first and second organic light emitting layers 116 and 126 may resonate between the dielectric mirror 113 as a reflex mirror and the second electrode 118 as a semi-transmission mirror. The resonance is provided at the geometric distance t2 from the dielectric mirror 113 to the second electrode 118. The geometric distance t2 may be adjusted according to an optical distance that optical resonance may occur. The optical distance from the dielectric mirror 113 to the second electrode 118 is equal to the sum of optical thicknesses of layers interposed between the dielectric mirror 113 and the second electrode 118. That is, the optical distance is equal to the sum of an optical thickness of the first organic light emitting layer 116 and an optical thickness of the first electrode 114. At this point, if a peak wavelength of a specific light that resonance occurs is λ, an optical distance may be an integer times of λ/2.

Except that the resonance occurs between the dielectric mirror 113 and the second electrode 118, an actual resonance principle is the same as the first embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 3:
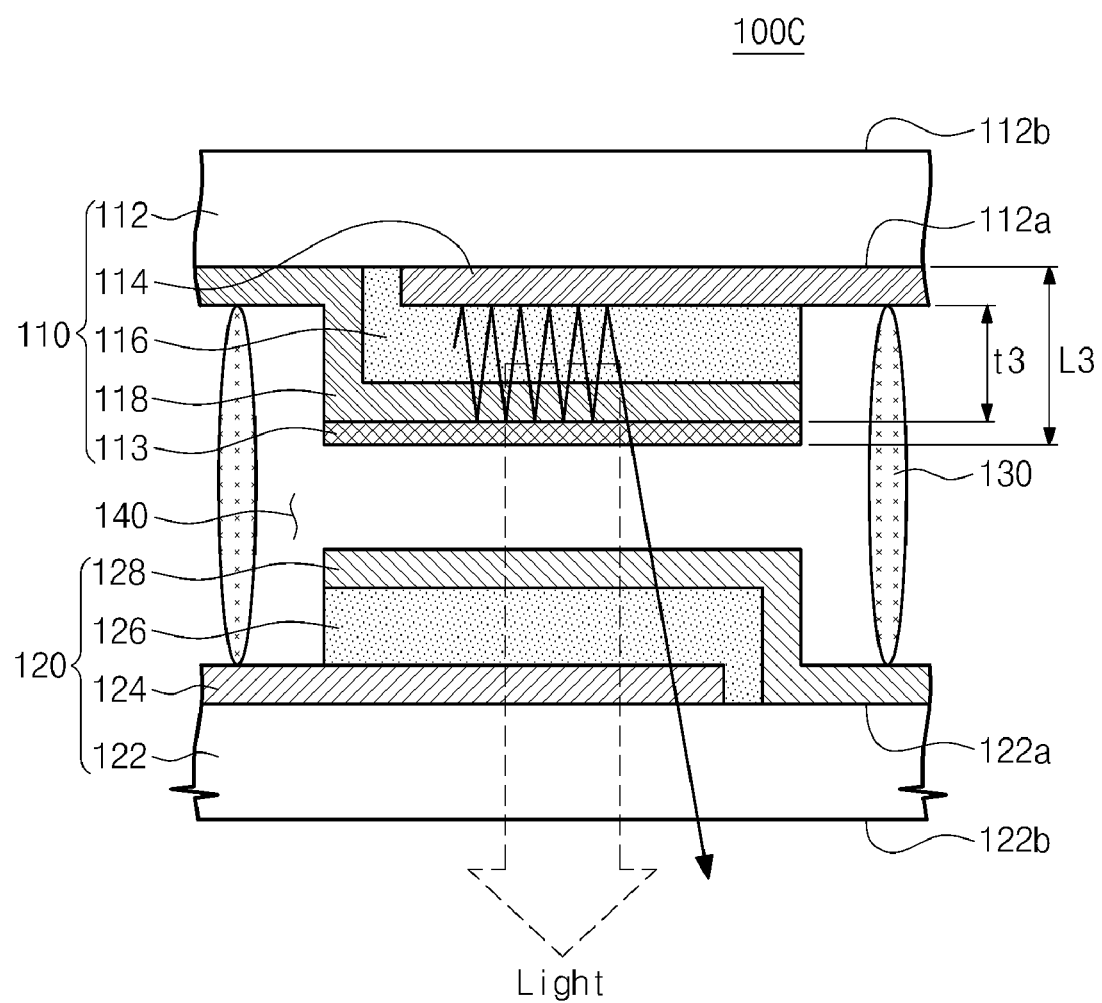

Hereinafter, the third embodiment will be described with reference to FIG. 3. Except that an organic electroluminescence device 100C according to the third embodiment of the present invention further includes a dielectric mirror 113 provided as a semi-transmission mirror on the top of the second electrode 118 of the first device 110 and the second electrode 118 is formed of a transmission electrode, the remaining components are identical to those of the first embodiment. Accordingly, overlapping description will be omitted and only differences will be described.

The first device 110 may include a first substrate 112 having first and second surfaces 112a and 112b facing each other, and the first electrode 114, the first organic light emitting layer 116, the first organic light emitting layer 116, the second electrode 118, and the dielectric mirror 130, which are sequentially stacked on the first surface 112a of the first substrate 112.

The second electrode 118 may include a transmission electrode. For example, the second electrode 118 may include Ag, Al, Mg, Mo, or an ally thereof. The dielectric mirror 113 is a semi-transmission layer provided as a semi-transmission mirror, where a low refractive index material and a high refractive index material are stacked alternately. The first device 110 may have a cavity structure L3 including of the first electrode 114 as a reflex mirror, the first organic light emitting layer 116, the second electrode 118, and the dielectric mirror 113 as a semi-transmission mirror.

One of the first and second lights emitted from the first and second organic light emitting layers 116 and 126 may resonate between the first electrode 114 and the dielectric mirror 113 as a reflex mirror. The resonance is provided at the geometric distance t3 from the first electrode 114 to the dielectric mirror 113. The geometric distance t3 may be adjusted according to an optical distance that optical resonance may occur. The optical distance from the first electrode 114 to the dielectric mirror 113 may be equal to the sum of optical thicknesses of layers interposed between the first electrode 141 and the dielectric mirror 113. That is, the optical distance may be equal to the sum of an optical thickness of the first organic light emitting layer 116 and an optical thickness of the second electrode 118. At this point, if a peak wavelength of a specific light that resonance occurs is $\lambda$, an optical distance may be an integer times of $\lambda/2$.

Except that the resonance occurs between the first electrode 114 and the dielectric mirror 113, an actual resonance principle may be the same as the first embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 4:
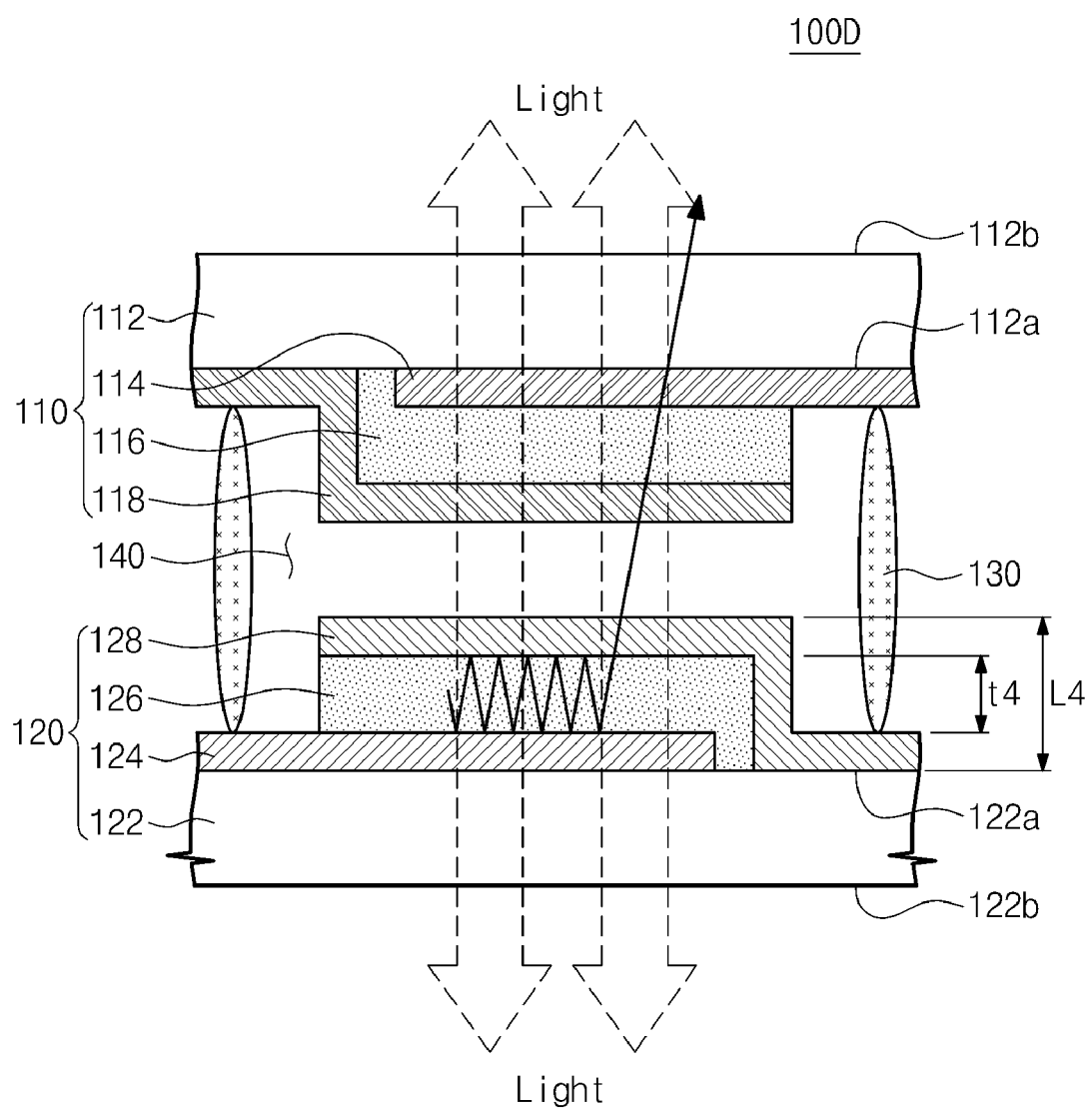

Hereinafter, the fourth embodiment will be described with reference to FIG. 4. In relation to an organic electroluminescence device 100D according to the fourth embodiment of the present invention, except that the first device 110 is a both sides light emitting type and the third and fourth electrodes 124 and 128 include a semi-transmission mirror and the light extraction film insertion position is different, the remaining components are identical to those of the first embodiment. Accordingly, overlapping description will be omitted and only differences will be described.

The first substrate 112 may include a transparent insulation material. For example, the first substrate 112 may include glass, plastic, or quartz.

The first and second electrodes 114 and 118 may include a transmission electrode. For example, the first and second electrodes 114 and 118 may include a transparent electrode (such as ITO or IZO), Ag, Al, Mg, Mo, or an alloy thereof. For example, the first electrode 14 may include ITO or IZO, and the second electrode 118 may include Ag, Al, Mg, Mo, or an alloy thereof.

The third and fourth electrodes 124 and 128 are semi-transmission layers provided as a semi-transmission mirror. The third electrode 124 may be formed of a double layer or a triple layer including a metal thin layer on, below, or in a transparent electrode to reflect and transmit a part of the light. Here, the transparent electrode may include ITO or IZO, and the metal thin layer may include Ag of a high reflectance. The fourth electrode 128 may include a metal having a thickness of less than 25 nm to reflect and transmit a part of the light. Here, the metal may be Ag, Al, Mg, Mo, or an alloy thereof.

The first device 110 having the above structure corresponds to a both sides light emitting type that the first light emitted from the first organic light emitting layer 116 is extracted toward the front and rear of the first substrate 112. Moreover, the second device 120 having the structure corresponds to a both sides light emitting type that the second light emitted from the second organic light emitting layer 126 is extracted toward the front and rear of the second substrate 122 and has a cavity structure L4 includes the third electrode 124 as a semi-transmission mirror, the second organic light emitting layer 126, and the fourth electrode 128 as a semi-transmission mirror. Therefore, the organic electroluminescence device 100D having the bonded first device 110 of a both sides light emitting type and second device 120 of a both sides light emitting type is completed.

Although not shown in the drawings, the organic electroluminescence device 100D may additionally include a light extraction film inserted between the first substrate 112 and the first electrode 114, between the second substrate 122 and the third electrode 124, or between the first device 110 and the second device 120, in order to improve light extraction efficiency.

One of the first and second lights emitted from the first and second organic light emitting layers 116 and 126 may resonate between the third electrode 124 and the fourth electrode 128 as semi-transmission mirrors. The resonance is provided at the geometric distance t4 from the third electrode 124 to the fourth electrode 128. The geometric distance t4 may be adjusted according to an optical distance that optical resonance may occur. The optical distance from the third electrode 124 to the fourth electrode 128 is equal to an optical thickness of the second organic light emitting layer 126. At this point, if a peak wavelength of a specific light that resonance occurs is $\lambda$, an optical distance may be an integer times of $\lambda/2$.

For example, the second light emitted from the second organic light emitting layer 126 is partially transmitted through and partially reflected by the third electrode 124 and by the fourth electrode 128. The second light reflected by the third and fourth electrodes 124 and 128 resonates at the geometric distance t4 between the third electrode 124 and the fourth electrode 128. Accordingly, constructive interference of the second light emitted from the second organic light emitting layer 126 occurs, and as a result, the light of an enhanced specific wavelength may be obtained.

Unlike this, a part of the first light emitted from the first organic light emitting layer 116 of the first device 110 is transmitted through the first electrode 114 and the remaining is transmitted through the second electrode 118. A part of the first light transmitted through the second electrode 118 is partially transmitted through and reflected by the fourth electrode 128. At this point, a part of the first light transmitted through the fourth electrode 128 is partially transmitted through and reflected by the third electrode 124, and resonate at the geometric distance t4 between the third electrode 124 and the fourth electrode 128. Accordingly, constructive interface of the first light occurs, and as a result, the light of an enhanced specific wavelength may be obtained.

Accordingly, constructive interference of the first light emitted from the first organic light emitting layer 116 or the second light emitted from the second organic light emitting layer 126 occurs, and as a result, the light of an enhanced specific wavelength may be obtained.

When voltages are applied to the first and second electrodes 114 and 118 and the third and fourth electrodes 124 and 128 of the organic electroluminescence device 100D, the first organic light emitting layer 116 emits the first light and the second organic light emitting layer 126 emits the second light. The first and second lights emitted from the first and second organic light emitting layers 116 and 126 are extracted to the external through the second side 112*b* of the first substrate 112 and the second side 122*b* of the second substrate 122. As a result, light emitted from the organic electroluminescence device 100D is finally emitted as white light by complementary color combination of the first light emitted from the first organic light emitting layer 116 and the second light emitted from the second organic light emitting layer 126.

Figure 5:
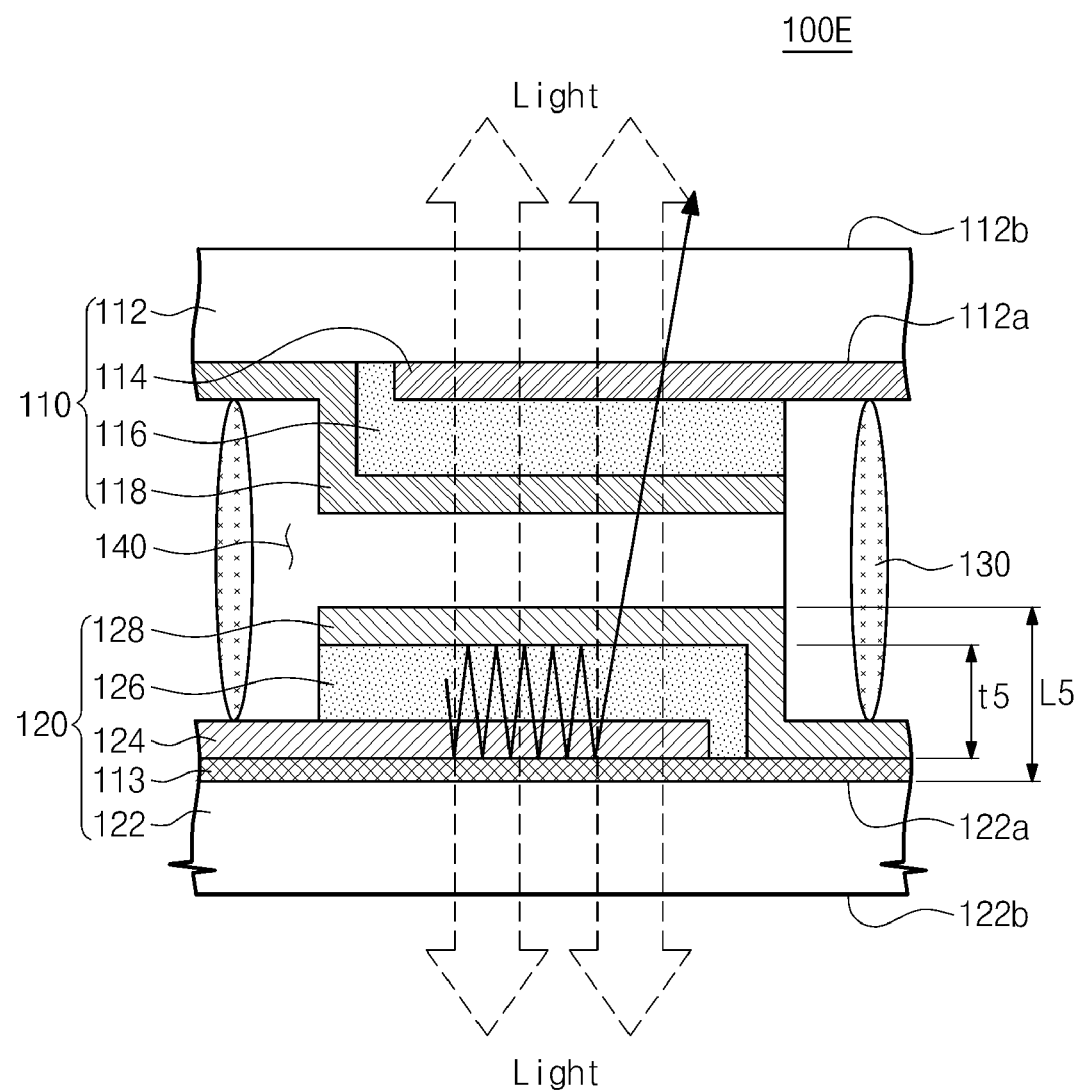

Hereinafter, referring to FIG. 5, the fifth embodiment of the present invention will be described. Except that an organic electroluminescence device 100E according to the fifth embodiment of the present invention further includes a dielectric mirror 113 provided as a semi-transmission mirror between the second substrate 122 and the third electrode 124 of the second device 120 and the third electrode 124 is formed of a transmission electrode, the remaining components are identical to those of the fourth embodiment. Accordingly, overlapping description will be omitted and only differences will be described.

The second device 120 may include a second substrate 122 having first and second surfaces 122*a* and 122*b* facing each other, and the dielectric mirror 113, the third electrode 124, the second organic light emitting layer 126, and the fourth electrode 128, which are sequentially stacked on the first surface 122*a* of the second substrate 122.

The dielectric mirror 113 is a semi-transmission layer provided as a semi-transmission mirror, where a low refractive index material and a high refractive index material are stacked alternately. The third electrode 124 may include a transmission electrode. For example, the third electrode 124 may include ITO or IZO. The second device 120 may have a cavity structure L5 including the dielectric mirror 113 as a reflex mirror, the third electrode 124, the second organic light emitting layer 126, and the fourth electrode 118 as a semi-transmission mirror.

One of the first and second lights emitted from the first and second organic light emitting layers 116 and 126 may resonate between the dielectric mirror 113 and the fourth electrode 128 as semi-transmission mirrors. The resonance is provided at the geometric distance t5 from the dielectric mirror 113 to the fourth electrode 128. The geometric distance t5 may be adjusted according to an optical distance that optical resonance may occur. The optical distance from the dielectric mirror 113 to the fourth electrode 128 is equal to the sum of an optical thickness of the third electrode 124 and an optical thickness of the second organic layer 126. At this point, if a peak wavelength of a specific light that resonance occurs is $\lambda$, an optical distance may be an integer times of $\lambda/2$.

Except that the resonance occurs between the dielectric mirror 113 and the second electrode 118, an actual resonance principle is the same as the first embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 6:
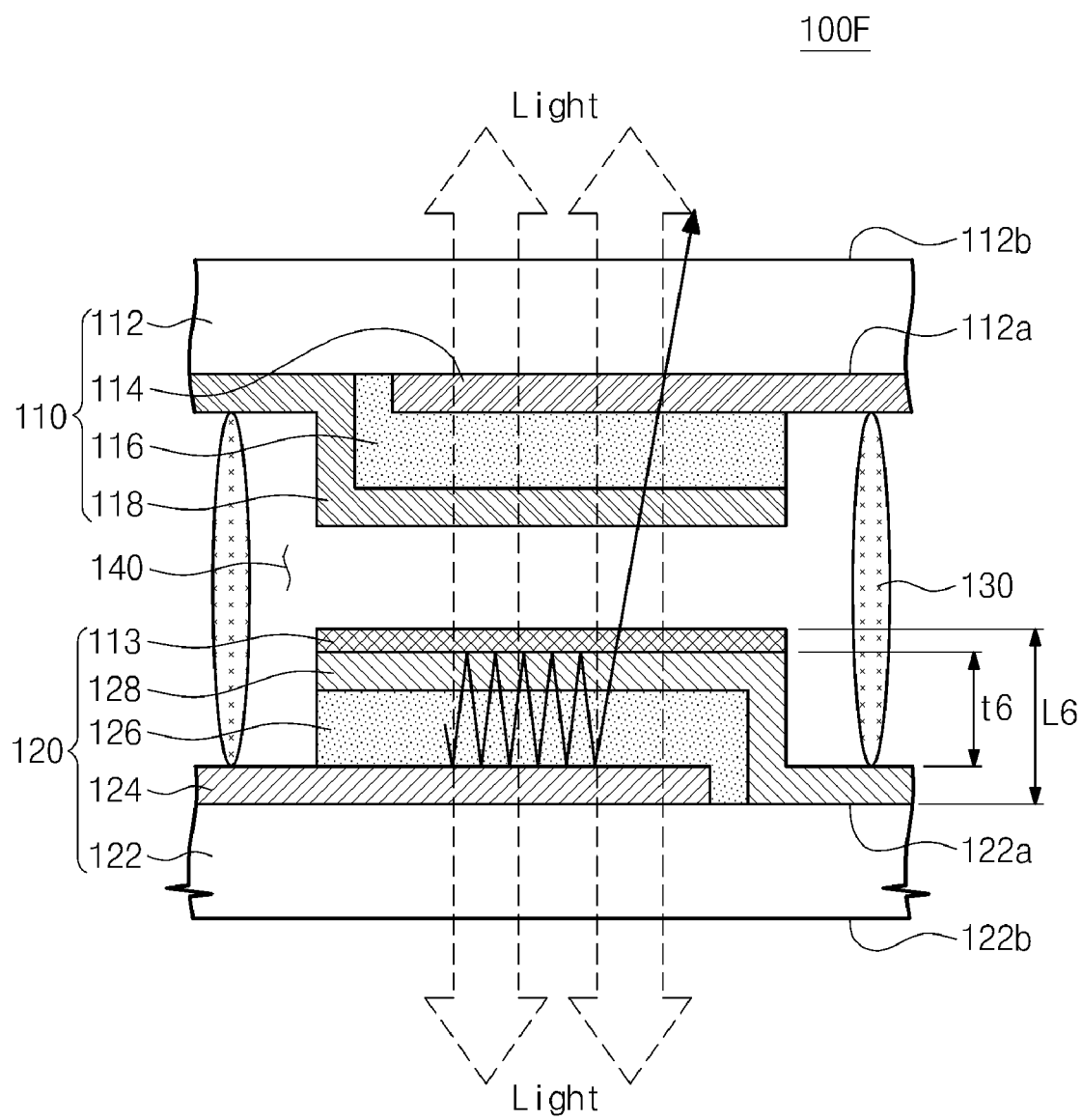

Hereinafter, the sixth embodiment will be described with reference to FIG. 6. Except that an organic electroluminescence device 100F according to the sixth embodiment of the present invention further includes a dielectric mirror 113 as a semi-transmission mirror on the top of the fourth electrode 128 of the second device 120 and the fourth electrode 128 is formed of a transmission electrode, the remaining components are identical to those of the fourth embodiment. Accordingly, overlapping description will be omitted and only differences will be described.

The second device 120 may include a second substrate 122 having first and second surfaces 122*a* and 122*b* facing each other, and the third electrode 124, the second organic light emitting layer 126, the fourth electrode 128, and the dielectric mirror 113 which are sequentially stacked on the first surface 122*a* of the second substrate 122.

The fourth electrode 128 may include a transmission electrode. For example, the fourth electrode 128 may include Ag, Al, Mg, Mo, or an alloy thereof. For example, the first electrode 14 may include ITO or IZO, and the second electrode 118 may include Ag, Al, Mg, Mo, or an alloy thereof. The dielectric mirror 113 is a semi-transmission layer provided as a semi-transmission mirror, where a low refractive index material and a high refractive index material are stacked alternately. The second device 120 may have a cavity structure L6 including the third electrode 124 as a semi-transmission mirror, the second organic light emitting layer 126, the fourth electrode, and the dielectric mirror 113 as a semi-transmission mirror.

One of the first and second lights emitted from the first and second organic light emitting layers 116 and 126 may resonate between the third electrode 124 and the dielectric mirror 113 as semi-transmission mirrors. The resonance is provided at the geometric distance t6 from the third electrode 124 to the dielectric mirror 113. The geometric distance t6 may be adjusted according to an optical distance that optical resonance may occur. The optical distance from the third electrode 124 to the dielectric mirror 113 is equal to the sum of an optical thickness of the second organic light emitting layer 126 and an optical thickness of the fourth electrode 128. At this point, if a peak wavelength of a specific light that resonance occurs is $\lambda$, an optical distance may be an integer times of $\lambda/2$.

Except that the resonance occurs between the third electrode 124 and the dielectric mirror 113, an actual resonance principle is the same as the fourth embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 7:
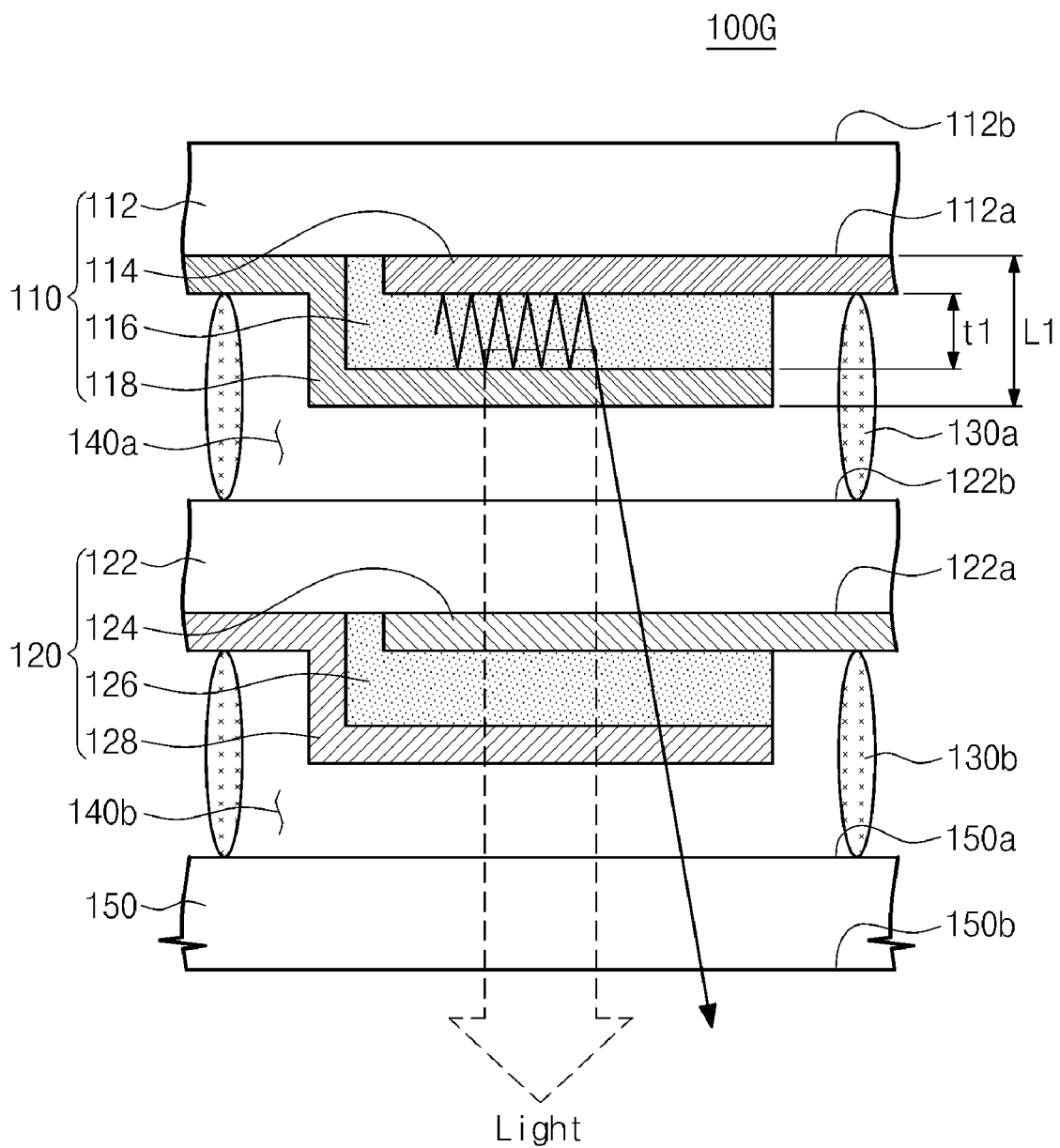

Hereinafter, the seventh embodiment will be described with reference to FIG. 7. Except that an organic electroluminescence device 100G according to the seventh embodiment of the present invention has a different bonding structure of the first device 110 and the second device 120 and a different optical extraction film insertion position and further includes a sealing material 150 and a second bonding layer 130*b* and the bonding layer 130 changes into a first bonding layer 130*a*, the remaining components are identical to those of the first embodiment. Accordingly, overlapping description will be omitted and only differences will be described.

The organic electroluminescence device 100G includes a first device 110, a second device 120 facing the first device 110, and the first bonding layer 130*a* bonding the first device 110 with the second device 120.

The first bonding layer 130*a* bonds the first surface 112*a* of the first substrate 112 with the second surface 122*b* of the second substrate 122 to allow them to face each other. By the first bonding layer 130*a*, a second electrode 118 faces the second substrate 122. If the first bonding layer 130*a* is bonded to a portion of the first electrode 114 and a portion of the second substrate 122, a first air layer 140*a* may be formed between the first device 110 and the second device 120. The organic electroluminescence device 100G may further include a sealing material 150 including first and second surfaces 150a and 150b facing each other and a second bonding layer 130b bonding the sealing material 150 with the second device 120.

The sealing material 150 is used to prevent moisture and oxygen from soaking into the organic electroluminescence device 100G from the external and is spaced part from and faces the second device 120. The sealing material 150 may include a transparent material such as glass. By the second bonding layer 130b, the first surface 122a of the second substrate 122 faces the first surface 150a of the sealing material 150. If the second bonding layer 130b is bonded to a portion of the third electrode 124 and a portion of the sealing material 150, a second air layer 140b is formed between the second device 120 and the sealing material 150. Since a material for forming the first and second bonding layers 130a and 130b may be identical to that of the bonding layer 130 of FIG. 1 of the first embodiment, its description will be omitted. At this point, an optical emission side of the organic electroluminescence device 100G becomes the second surface 150b of the sealing material 150.

Although not shown in the drawings, the organic electroluminescence device 100G may further include a light extraction film inserted between the second substrate 122 and the third electrode 124, between the fourth electrode 128 and the second air layer 140b, or between the first device 110 and the second device 120, in order to improve light extraction efficiency.

According to the seventh embodiment of the present invention, an actual resonance principle in the first electrode 114 as a reflex mirror and the second electrode 118 as a semi-transmission mirror with respect to the first and second lights emitted from the first and second organic light emitting layers 116 and 126 is the same as the first embodiment. Accordingly, constructive interference of the first light emitted from the first organic light emitting layer 116 or the second light emitted from the second organic light emitting layer 126 occurs, and as a result, the light of an enhanced specific wavelength may be obtained.

When voltages is applied to the first and second electrodes 114 and 118 and the third and fourth electrodes 124 and 128 of the organic electroluminescence device 100G, the first organic light emitting layer 116 emits the first light and the second organic light emitting layer 126 emits the second light. The first and second lights emitted from the first and second organic light emitting layers 116 and 126 are extracted to the external through the second surface 150b of the sealing material 150. As a result, light emitted from the organic electroluminescence device 100D is finally emitted as white light by complementary color combination of the first light emitted from the first organic light emitting layer 116 and the second light emitted from the second organic light emitting layer 126.

Figure 8:
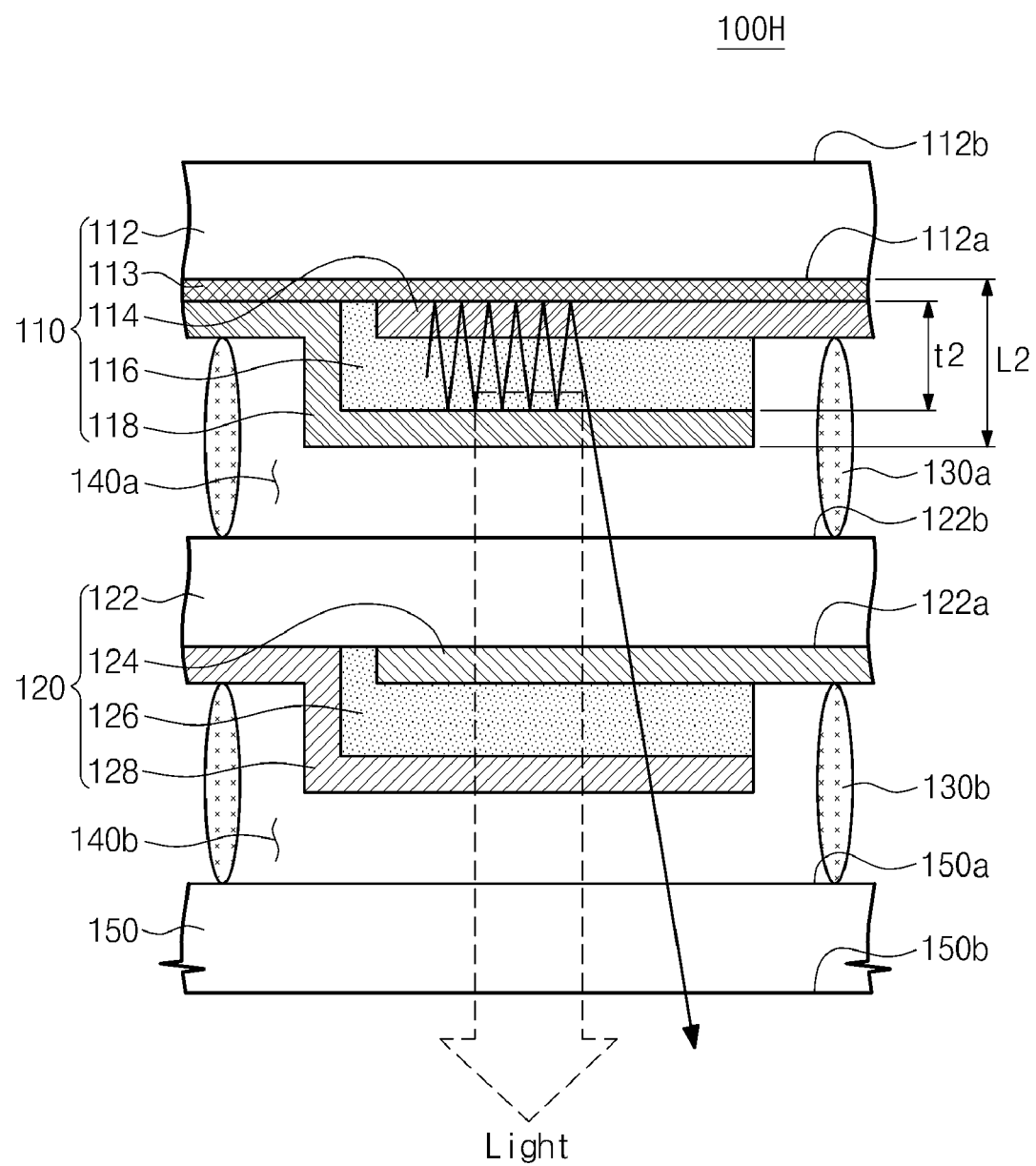

Hereinafter, referring to FIG. 8, the eighth embodiment of the present invention will be described. Except that an organic electroluminescence device 100H according to the eighth embodiment of the present invention further includes a dielectric mirror 113 provided as a reflex mirror between the first substrate 112 and the first electrode 114 of the first device 110 and the first electrode 114 is formed of a transmission electrode, the remaining components are identical to those of the seventh embodiment. Accordingly, overlapping description will be omitted and only differences will be described.

The first device 110 may include a first substrate 112 having first and second surfaces 112a and 112b facing each other, and the dielectric mirror 113, the first electrode 114, the first organic light emitting layer 116, and the second electrode 118, which are sequentially stacked on the first surface 112a of the first substrate 112.

The dielectric mirror 113 is a semi-transmission layer provided as a semi-transmission mirror, where a low refractive index material and a high refractive index material are stacked alternately. The first electrode 114 may include a transmission electrode. For example, the first electrode 114 may include ITO or IZO.

The first device 110 may have a cavity structure L2 including the dielectric mirror 113 as a reflex mirror, the first electrode 114, the first organic light emitting layer 116, and the second electrode 118 as a semi-transmission mirror.

One of the first and second lights emitted from the first and second organic light emitting layers 116 and 126 may resonate between the dielectric mirror 113 as a reflex mirror and the second electrode 118 as a semi-transmission mirror. The resonance is provided at the geometric distance t2 from the dielectric mirror 113 to the second electrode 118. The geometric distance t2 may be adjusted according to an optical distance that optical resonance may occur. The optical distance from the dielectric mirror 113 to the second electrode 118 is equal to the sum of an optical thickness of the first electrode 114 and an optical thickness of the first organic light emitting layer 116. At this point, if a peak wavelength of a specific light that resonance occurs is $\lambda$, an optical distance may be an integer times of $\lambda/2$.

Except that the resonance occurs between the dielectric mirror 113 and the second electrode 118, an actual resonance principle is the same as the seventh embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 9:
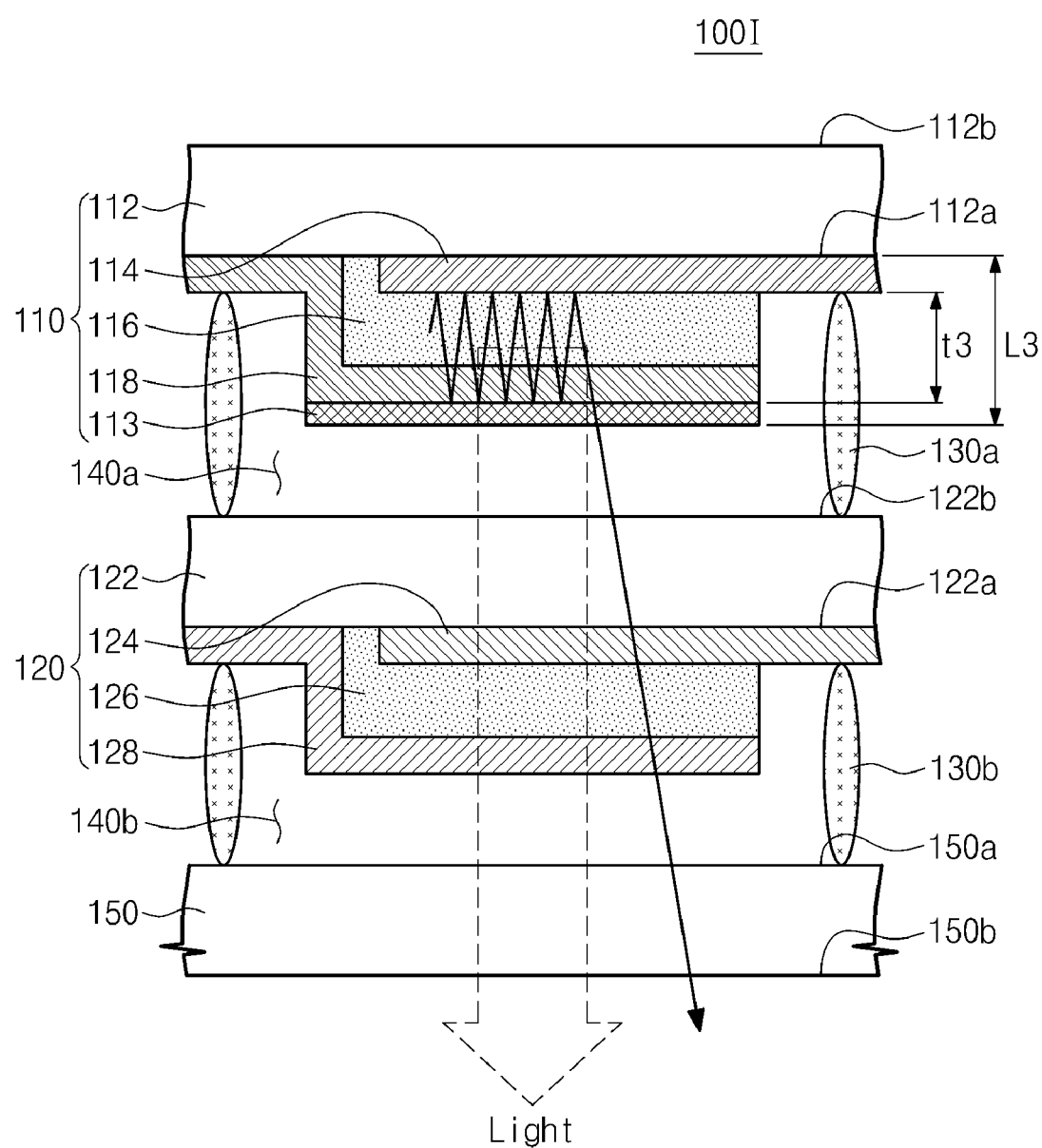

Hereinafter, the ninth embodiment will be described with reference to FIG. 9. Except that an organic electroluminescence device 100I according to the ninth embodiment of the present invention further includes a dielectric mirror 113 on the top of the second electrode 118 of the first device 110 and the second electrode 118 is formed of a transmission electrode, the remaining components are identical to those of the seventh embodiment. Accordingly, overlapping description will be omitted and only differences will be described.

The first device 110 may include a first substrate 112 having first and second surfaces 112a and 112b facing each other, and the first electrode 114, the first organic light emitting layer 116, the second electrode, and the dielectric mirror 113, which are sequentially stacked on the first surface 112a of the first substrate 112.

The second electrode 118 may be formed of a transmission electrode. For example, the second electrode 118 may include Ag, Al, Mg, Mo, or an alloy thereof. The dielectric mirror 113 is a semi-transmission layer provided as a semi-transmission mirror, where a low refractive index material and a high refractive index material are stacked alternately.

The first device 110 may have a cavity structure L3 including the first electrode 114 as a reflex mirror, the first organic light emitting layer 116, the second electrode 118, and the dielectric mirror 113 as a semi-transmission mirror.

One of the first and second lights emitted from the first and second organic light emitting layers 116 and 126 may resonate between the first electrode 114 as a reflex mirror and the dielectric mirror 113 as a semi-transmission mirror. The resonance is provided at the geometric distance t3 from the first electrode 114 to the second electrode 118. The geometric distance t3 may be adjusted according to an optical distance that optical resonance may occur. The optical distance from the first electrode 114 to the dielectric mirror 113 is equal to the sum of an optical thickness of the first organic light emitting layer 116 and an optical thickness of the second electrode 118. At this point, if a peak wavelength of a specific light that resonance occurs is λ, an optical distance may be an integer times of λ/2.

Except that the resonance occurs between the first electrode 114 and the dielectric mirror 113, an actual resonance principle is the same as the seventh embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 10:
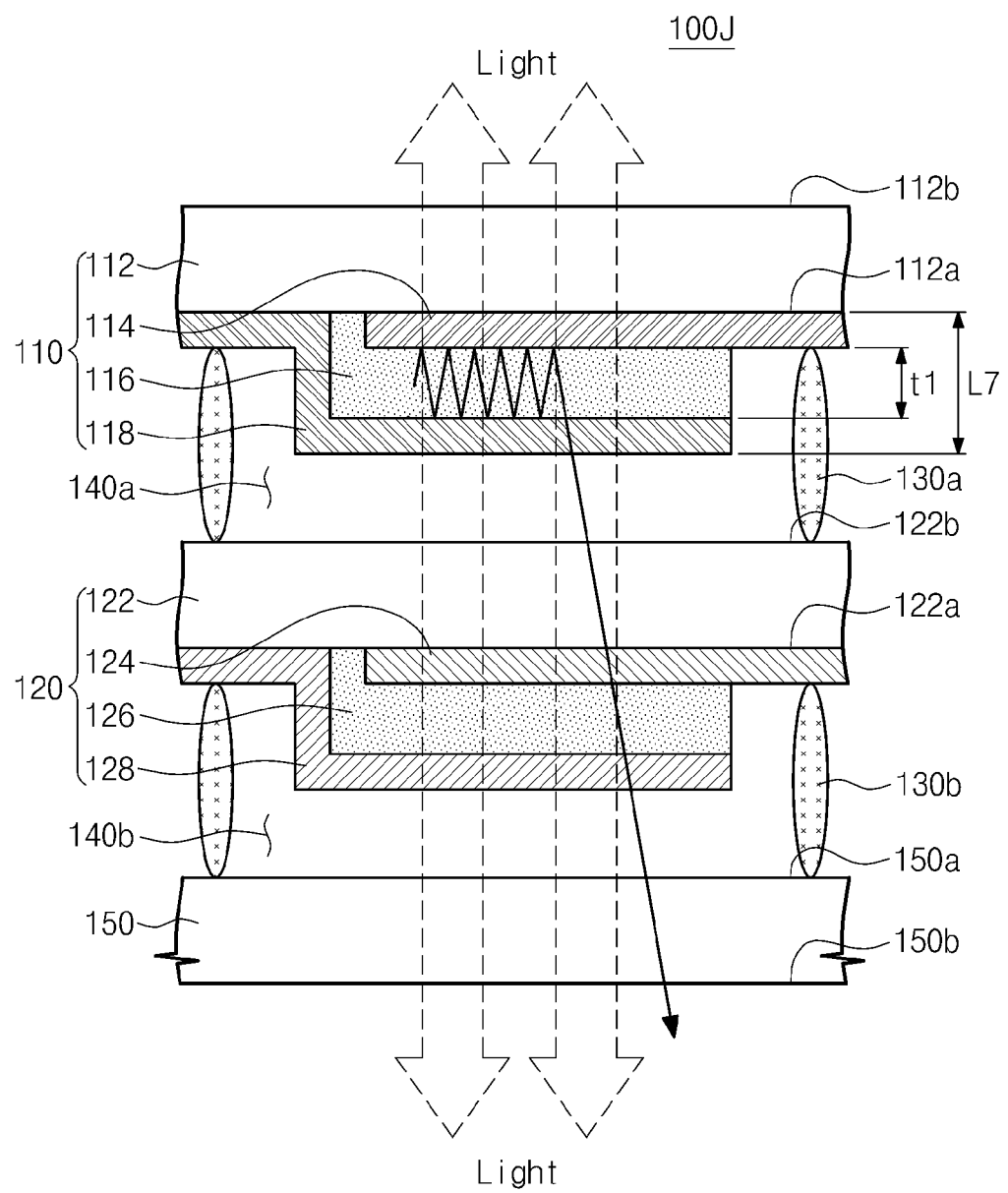

Hereinafter, the tenth embodiment will be described with reference to FIG. 10. In relation to an organic electroluminescence device 100J according to the tenth embodiment of the present invention, except that the first device 110 is a both sides light emitting type, the remaining components are identical to those of the seventh embodiment. Accordingly, overlapping description will be omitted and only differences will be described.

The first substrate 112 may include a transparent insulation material. For example, the first substrate 112 may include glass, plastic, or quartz.

The first and second electrodes 114 and 118 are semi-transmission layers provided as a semi-transmission mirror. The first electrode 114 may be formed of a double layer or a triple layer including a metal thin layer on, below, or in a transparent electrode to reflect and transmit a part of the light. Here, the transparent electrode may include ITO or IZO, and the metal thin layer may include Ag of high reflectance.

The first device 110 having the above structure corresponds to a both sides light emitting type that the first light emitted from the first organic light emitting layer 116 is extracted toward the front and rear of the first substrate 112 has a cavity structure L7 including the first electrode 114 as a semi-transmission mirror, the first organic light emitting layer 116, and the second electrode 118 as a semi-transmission mirror. Therefore, the organic electroluminescence device 100D having the bonded first device 110 of a both sides light emitting type and second device 120 of a both sides light emitting type is completed.

Although not shown in the drawings, the organic electroluminescence device 100J may additionally include a light extraction film inserted between the first substrate 112 and the first electrode 114, between the second substrate 122 and the third electrode 124, or between the first device 110 and the second device 120, in order to improve light extraction efficiency.

One of the first and second lights emitted from the first and second organic light emitting layers 116 and 126 may resonate between the first electrode 114 and the second electrode 118 as semi-transmission mirrors. The resonance is provided at the geometric distance t1 from the first electrode 114 to the second electrode 118. The geometric distance t1 may be adjusted according to an optical distance that optical resonance may occur. The optical distance from the first electrode 114 to the second electrode 118 is equal to an optical thickness of the first organic light emitting layer 116. At this point, if a peak wavelength of a specific light that resonance occurs is λ, an optical distance may be an integer times of λ/2.

For example, the first light emitted from the first organic light emitting layer 116 is partially transmitted through and partially reflected by the first electrode 114 and the second electrode 118. The first light reflected by the first and second electrodes 114 and 118 resonates at the geometric distance t1 between the first electrode 114 and the second electrode 118. Accordingly, constructive interference of the second light emitted from the first organic light emitting layer 116 occurs, and as a result, the light of an enhanced specific wavelength may be obtained.

Unlike this, a part of the second light emitted from the second organic light emitting layer 126 of the second device 120 is transmitted through the third electrode 124 and the remaining is transmitted through the fourth electrode 128. A part of the second light transmitted through the fourth electrode 128 is partially transmitted through and reflected by the second electrode 118. At this point, a part of the second light transmitted through the second electrode 118 is partially transmitted through and reflected by the first electrode 114, and resonate at the geometric distance t1 between the first electrode 114 and the second electrode 118. Accordingly, constructive interface of the second light occurs, and as a result, the light of an enhanced specific wavelength may be obtained.

When voltages is applied to the first and second electrodes 114 and 118 and the third and fourth electrodes 124 and 128 of the organic electroluminescence device 100J, the first organic light emitting layer 116 emits the first light and the second organic light emitting layer 126 emits the second light. The first and second lights emitted from the first and second organic light emitting layers 116 and 126 are extracted to the external through the second surface 112b of the first substrate 112 and the second surface 150b of the sealing material 150. As a result, light emitted from the organic electroluminescence device 100J is finally emitted as white light by complementary color combination of the first light emitted from the first organic light emitting layer 116 and the second light emitted from the second organic light emitting layer 126.

Figure 11:
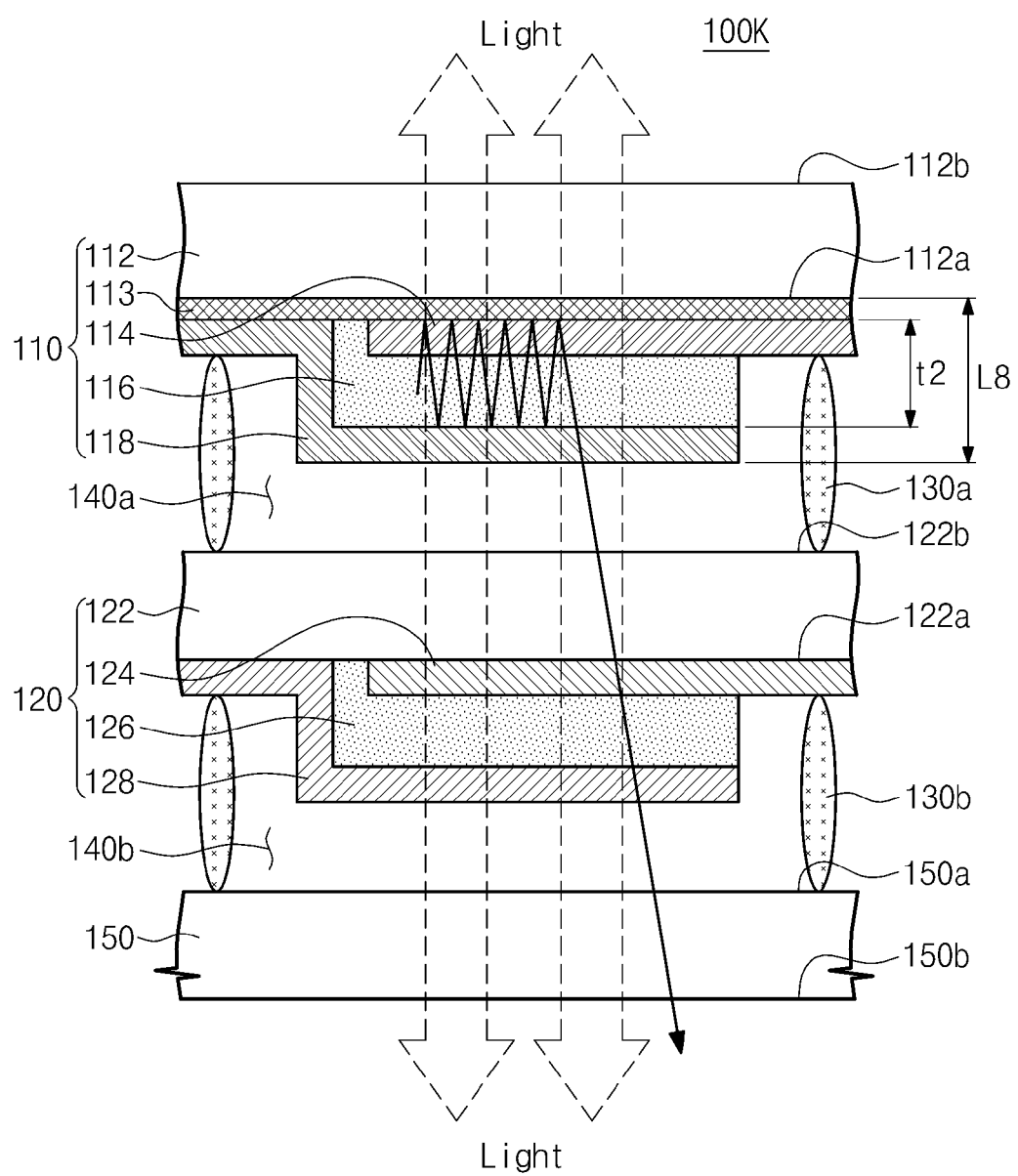

Hereinafter, referring to FIG. 11, the eleventh embodiment of the present invention will be described. Except that an organic electroluminescence device 100K according to the eleventh embodiment of the present invention further includes a dielectric mirror 113 provided as a semi-transmission mirror between the first substrate 112 and the first electrode 114 of the first device 110 and the first electrode 114 is formed of a transmission electrode, the remaining components are identical to those of the tenth embodiment. Accordingly, overlapping description will be omitted and only differences will be described.

The first device 110 may include a first substrate 112 having first and second surfaces 112a and 112b facing each other, and the dielectric mirror 113, the first electrode 114, the first organic light emitting layer 116, and the second electrode 118, which are sequentially stacked on the first side 112a of the first substrate 112.

The dielectric mirror 113 is a semi-transmission layer provided as a semi-transmission mirror, where a low refractive index material and a high refractive index material are stacked alternately. The first electrode 114 may include a transmission electrode. For example, the first electrode 114 may include ITO or IZO.

The first device 110 may have a cavity structure L8 including the dielectric mirror 113 as a semi-transmission mirror, the first electrode 114, the first organic light emitting layer 116, and the second electrode 118 as a semi-transmission mirror.

One of the first and second lights emitted from the first and second organic light emitting layers 116 and 126 may resonate between the dielectric mirror 113 as a semi-transmission mirror and the second electrode 118 as a semi-transmission mirror. The resonance is provided at the geometric distance t2 from the dielectric mirror 113 to the second electrode 118. The geometric distance t2 may be adjusted according to an optical distance that optical resonance may occur. The optical distance from the dielectric mirror 113 to the second electrode 118 is equal to the sum of an optical thickness of the first electrode 114 and an optical thickness of the first organic light emitting layer 116. At this point, if a peak wavelength of a specific light that resonance occurs is λ, an optical distance may be an integer times of λ/2.

Except that the resonance occurs between the dielectric mirror 113 and the second electrode 118, an actual resonance principle is the same as the seventh embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 12:
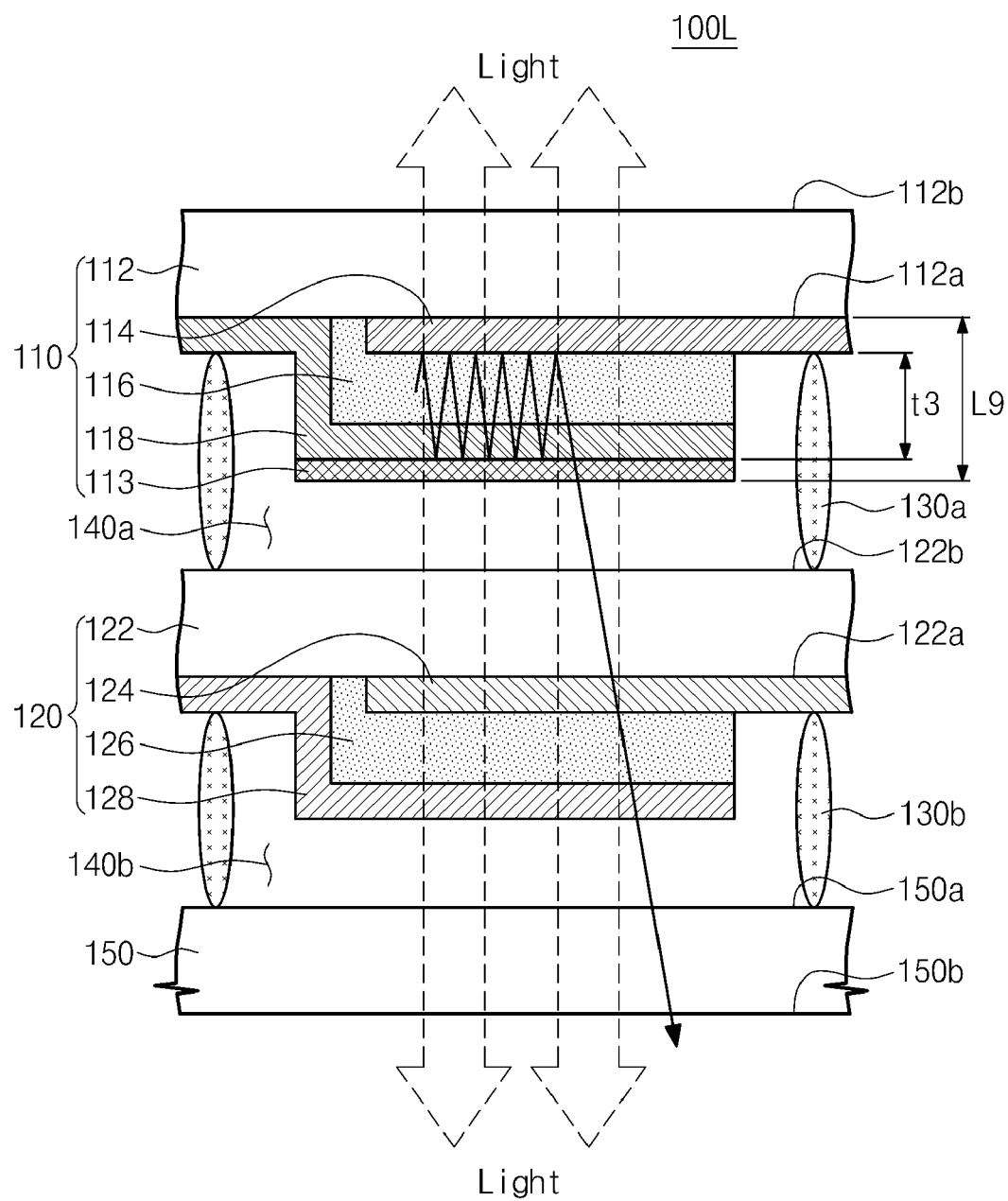

Hereinafter, the twelfth embodiment will be described with reference to FIG. 12. Except that an organic electroluminescence device 100L according to the twelfth embodiment of the present invention further includes a dielectric mirror 113 as a semi-transmission mirror on the top of the second electrode 118 of the first device 110 and the second electrode 118 is formed of a transmission electrode, the remaining components are identical to those of the tenth embodiment. Accordingly, overlapping description will be omitted and only differences will be described.

The first device 110 may include a first substrate 112 having first and second surfaces 112a and 112b facing each other, and the first electrode 114, the first organic light emitting layer 116, the second electrode, and the dielectric mirror 113, which are sequentially stacked on the first surface 112a of the first substrate 112.

The second electrode 118 may be formed of a transmission electrode. For example, the second electrode 118 may include Ag, Al, Mg, Mo, or an alloy thereof. The dielectric mirror 113 is a semi-transmission layer provided as a semi-transmission mirror, where a low refractive index material and a high refractive index material are stacked alternately.

The first device 110 may have a cavity structure L9 including the first electrode 114 as a semi-transmission mirror, the first organic light emitting layer 116, the second electrode 118, and the dielectric mirror 113 as a semi-transmission mirror.

One of the first and second lights emitted from the first and second organic light emitting layers 116 and 126 may resonate between the first electrode 114 as a semi-transmission mirror and the dielectric mirror 113 as a semi-transmission mirror. The resonance is provided at the geometric distance t3 from the first electrode 114 to the second electrode 118. The geometric distance t3 may be adjusted according to an optical distance that optical resonance may occur. The optical distance from the first electrode 114 to the dielectric mirror 113 is equal to the sum of an optical thickness of the first organic light emitting layer 116 and an optical thickness of the second electrode 118. At this point, if a peak wavelength of a specific light that resonance occurs is λ, an optical distance may be an integer times of λ/2.

Except that the resonance occurs between the first electrode 114 and the dielectric mirror 113, an actual resonance principle is the same as the tenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 13:
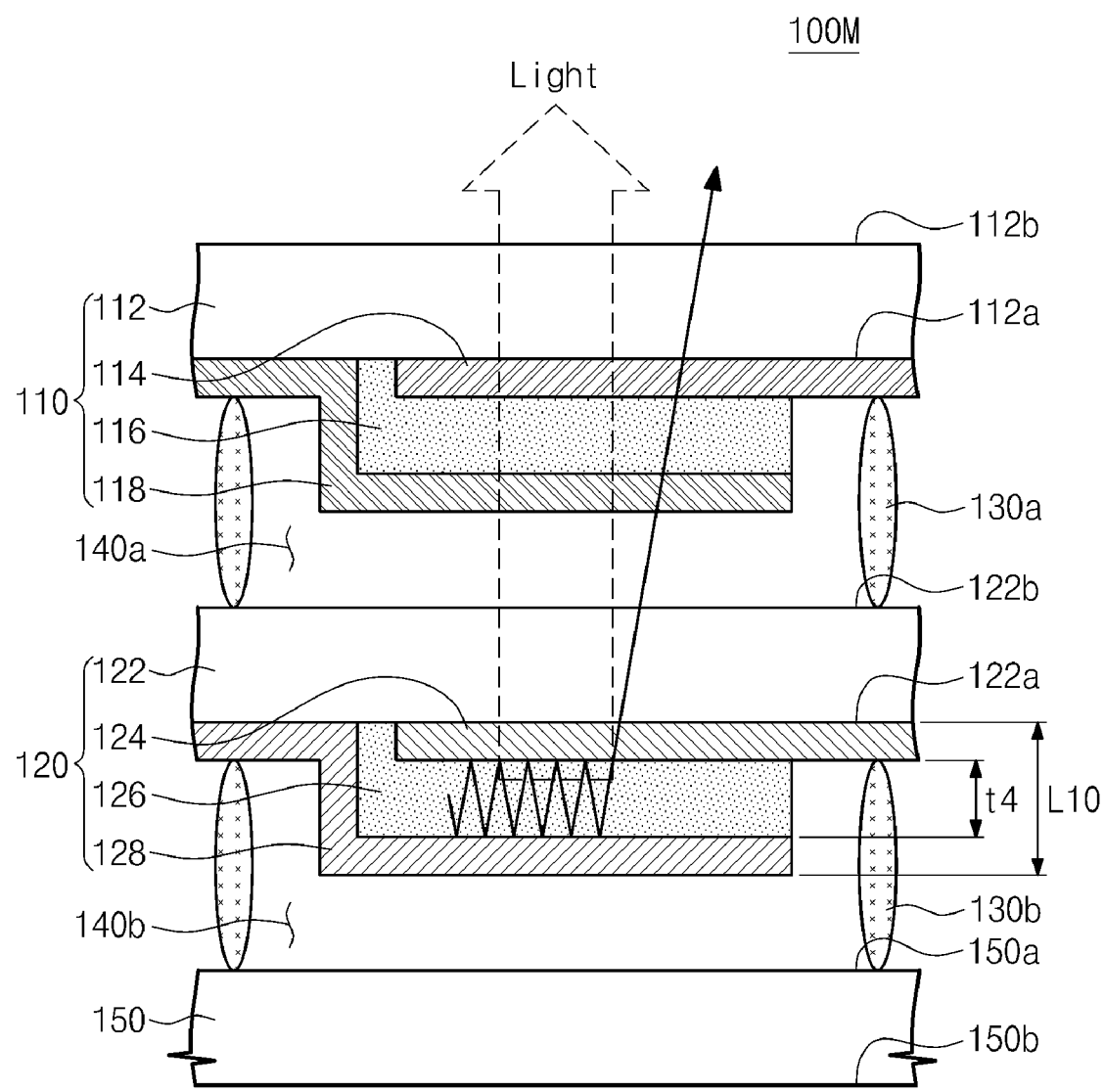

Hereinafter, the thirteenth embodiment will be described with reference to FIG. 13. In relation to an organic electroluminescence device 100M according to the thirteenth embodiment of the present invention, except that the first device 110 is a both sides light emitting type and the second device 120 is a rear side light emitting type and a material used for forming the sealing material 150 is different, the remaining components are identical to those of the seventh embodiment. Accordingly, overlapping description will be omitted and only differences will be described.

The first substrate 112 may include a transparent insulation material. For example, the first substrate 112 may include glass, plastic, or quartz.

The first and second electrodes 114 and 118 are formed of a transmission electrode. The first and second electrodes 114 and 118 may include a transparent electrode (such as ITO or IZO), Ag, Al, Mg, Mo, or an alloy thereof. For example, the first electrode 114 may include ITO or IZO, and the second electrode 118 may include Ag, Al, Mg, Mo, or an ally thereof. In order to improve external light efficiency, one of the first electrode 114 or the second electrode 118 may be formed with a metal thin layer of a high reflectance.

The third electrodes 124 is a semi-transmission layer provided as a semi-transmission mirror. The third electrode 124 may be formed of a double layer or a triple layer including a metal thin layer on, below, or in a transparent electrode to transmit a part of the light. Here, the transparent electrode may include ITO or IZO, and the metal thin layer may include Ag of a high reflectance. The fourth electrode 128 may include a thick metal for total reflection, as a reflex layer provided as a reflex mirror. For example, the fourth electrode 128 may include Ag, Al, Mg, Mo, or an alloy thereof.

The first device 110 having the above structure corresponds to a both sides light emitting type that the first light emitted from the first organic light emitting layer 116 is extracted toward the front and rear of the first substrate 112. Moreover, the second device 120 having the structure corresponds to a rear side light emitting type that the second light emitted from the second organic light emitting layer 126 is extracted toward the rear of the second substrate 122 and has a cavity structure L10 including the third electrode 124 as a semi-transmission mirror, the second organic light emitting layer 126, and the fourth electrode 128 as a semi-transmission mirror. Therefore, the organic electroluminescence device 100M having the bonded first device 110 of a both sides light emitting type and second device 120 of a rear side light emitting type is completed.

The sealing material 150 is not limited to a transparent material and may be formed of an opaque material. Although not shown in the drawings, the organic electroluminescence device 100M may further include a light extraction film inserted between the first substrate 112 and the first electrode 114, between the second substrate 122 and the third electrode 124, or between the first device 110 and the second device 120, in order to improve light extraction efficiency.

One of the first and second lights emitted from the first and second organic light emitting layers 116 and 126 may resonate between the third electrode 124 as a semi-transmission mirror and the fourth electrode 128 as a reflex mirror. The resonance is provided at the geometric distance t4 from the third electrode 124 to the fourth electrode 128. The geometric distance t4 may be adjusted according to an optical distance that optical resonance may occur. The optical distance from the third electrode 124 to the fourth electrode 128 is equal to an optical thickness of the second organic light emitting layer 126. At this point, if a peak wavelength of a specific light that resonance occurs is λ, an optical distance may be an integer times of λ/2.

For example, a part of the second light emitted from the second organic light emitting layer 126 and progressing toward the top direction is partially transmitted through and partially reflected by the third electrode 124. The second light reflected by the third electrode 124 is reflected by the fourth electrode and again progresses into the top direction, and then partially transmitted through and reflected by the fourth electrode 128. Accordingly, constructive interference of the second light occurs, and as a result, the light of an enhanced specific wavelength may be obtained.

Unlike this, the first light emitted from the first organic light emitting layer 116 of the first device 110 is partially transmitted through the first electrode 114 and is partially transmitted through the second electrode 118. A part of the first light transmitted through the second electrode 118 is transmitted through the third electrode 124 and may resonate between the third electrode 124 and the fourth electrode 128. Accordingly, constructive interference of the first light emitted from the first organic light emitting layer 116 occurs, and as a result, the light of an enhanced specific wavelength may be obtained.

When voltages is applied to the first and second electrode 114 and 118 and the third and fourth electrodes 124 and 128 of the organic electroluminescence device 100M, the first organic light emitting layer 116 emits the first light and the second organic light emitting layer 126 emits the second light. The first and second lights emitted from the first and second organic light emitting layers 116 and 126 are extracted to the external through the second side 122b of the second substrate 122. As a result, the light emitted from the organic electroluminescence device 100M emits white light finally by complementary color combination of the first light emitted from the first organic light emitting layer 116 and the second light emitted from the second organic light emitting layer 126.

Figure 14:
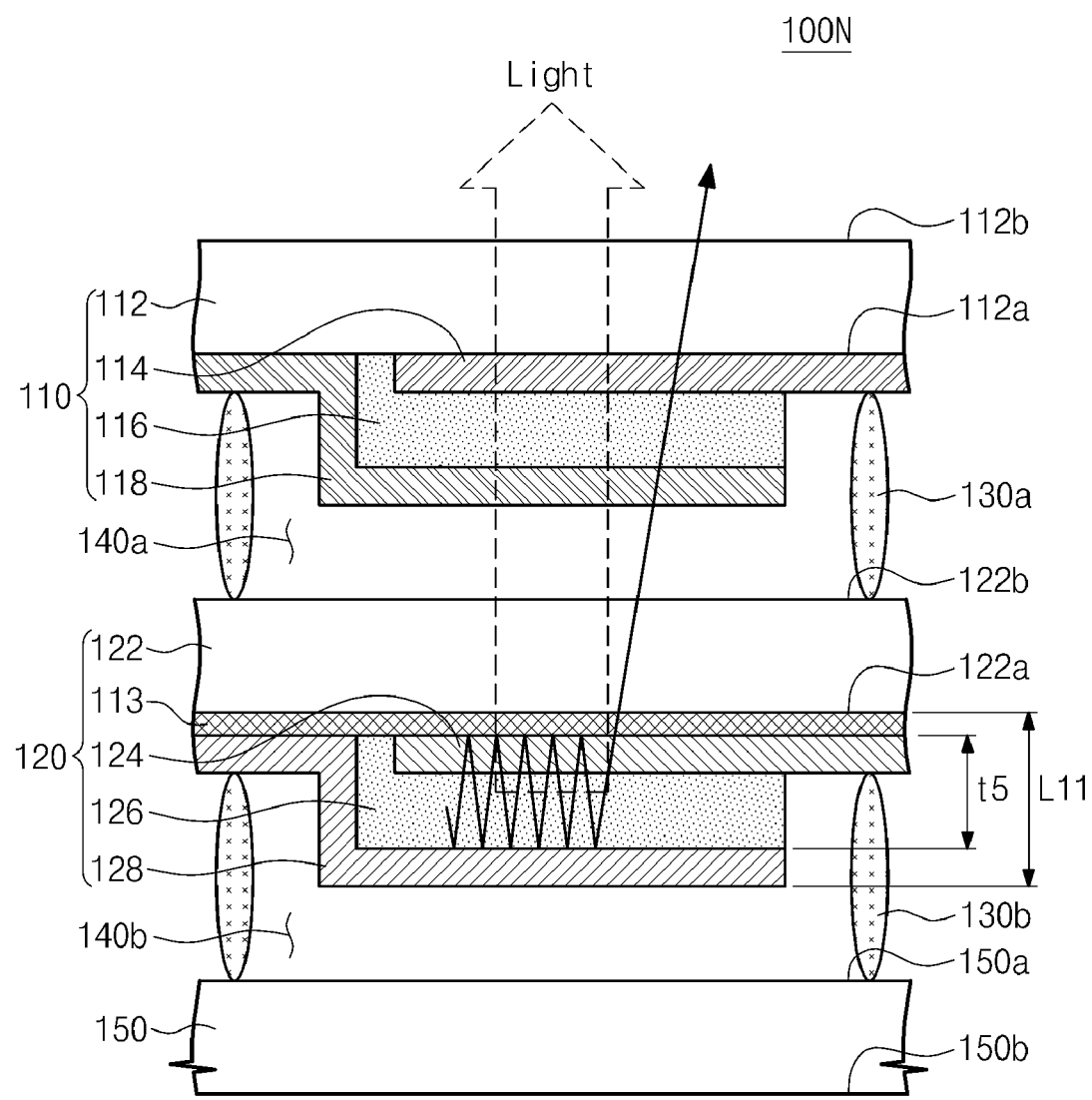

Hereinafter, referring to FIG. 14, the fourteenth embodiment of the present invention will be described. Except that an organic electroluminescence device 100N according to the fourteenth embodiment of the present invention further includes a dielectric mirror 113 provided as a semi-transmission mirror between the second substrate 122 and the third electrode 124 of the second device 120 and the third electrode 124 is formed of a transmission electrode, the remaining components are identical to those of the thirteenth embodiment. Accordingly, overlapping description will be omitted and only differences will be described.

The second device 120 may include a second substrate 122 having first and second surfaces 122a and 122b facing each other, and the dielectric mirror 113, the third electrode 124, the second organic light emitting layer 126, and the fourth electrode 128, which are sequentially stacked on the first surface 122a of the second substrate 122.

The dielectric mirror 113 is a semi-transmission layer provided as a semi-transmission mirror, where a low refractive index material and a high refractive index material are stacked alternately. The third electrode 124 may include a transmission electrode. For example, the third electrode 124 may include ITO or IZO. The second device 120 may have a cavity structure L11 including the dielectric mirror 113 as a semi-transmission mirror, the third electrode 124, the second organic light emitting layer 126, and the fourth electrode 118 as a reflex mirror.

One of the first and second lights emitted from the first and second organic light emitting layers 116 and 126 may resonate between the dielectric mirror 113 as a semi-transmission mirror and the fourth electrode 128 as a reflex mirror. The resonance is provided at the geometric distance t5 from the dielectric mirror 113 to the fourth electrode 128. The geometric distance t5 may be adjusted according to an optical distance that optical resonance may occur. The optical distance from the dielectric mirror 113 to the fourth electrode 128 is equal to the sum of optical thicknesses of layers interposed between the dielectric mirror 113 and the fourth electrode 128. That is, the optical distance is equal to the sum of an optical thickness of the third electrode 124 and an optical thickness of the second organic light emitting layer 126. At this point, if a peak wavelength of a specific light that resonance occurs is λ, an optical distance may be an integer times of λ/2.

Except that the resonance occurs between the dielectric mirror 113 and the fourth electrode 128, an actual resonance principle is the same as the thirteenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 15:
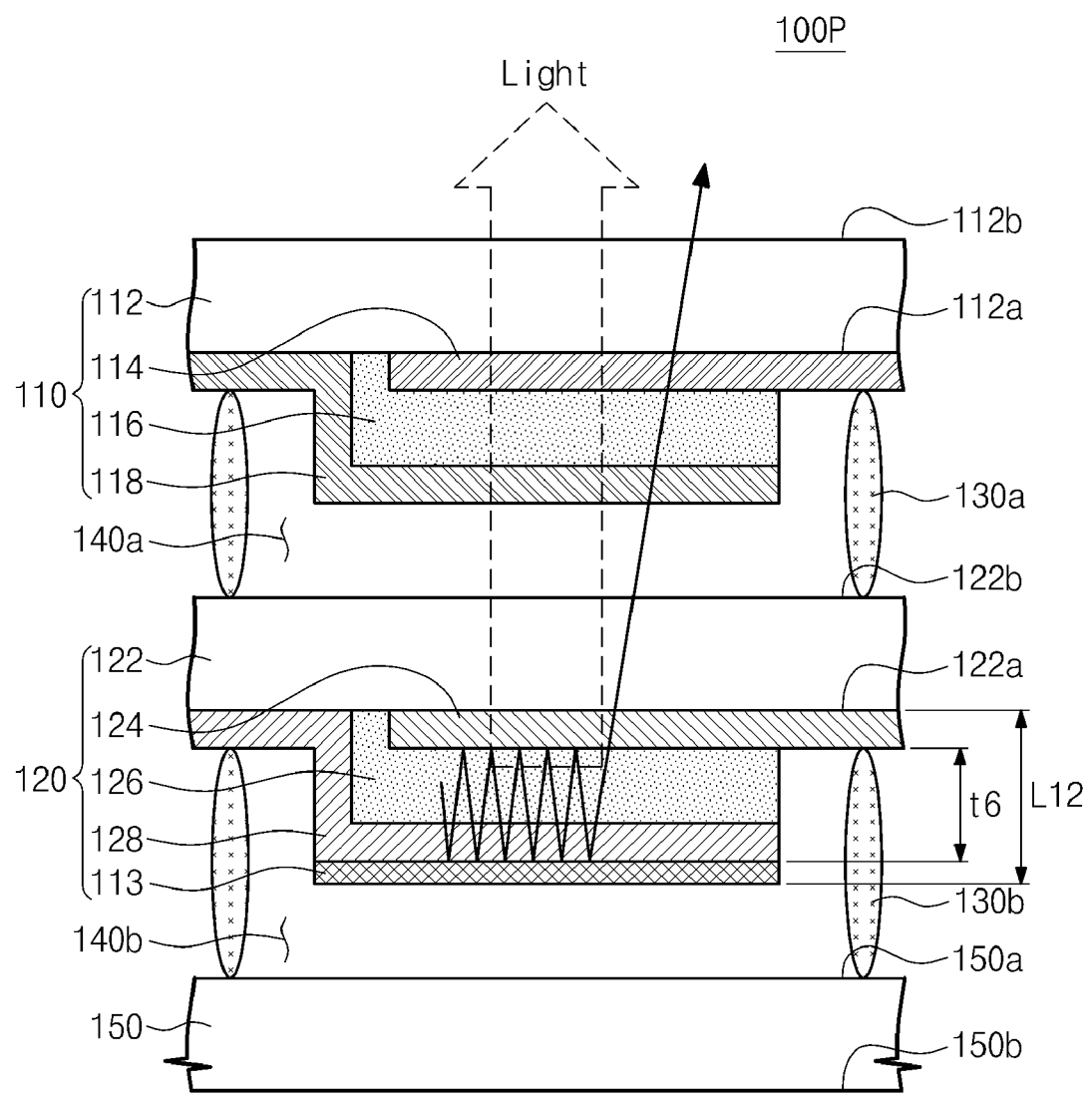

Hereinafter, the fifteenth embodiment will be described with reference to FIG. 15. Except that an organic electroluminescence device 100P according to the fifteenth embodiment of the present invention further includes a dielectric mirror 113 provided as a reflex mirror on the top of the fourth electrode 128 of the second device 120 and the fourth electrode 128 is formed of a transmission electrode, the remaining components are identical to those of the thirteenth embodiment. Accordingly, overlapping description will be omitted and only differences will be described.

The second device 120 may include a second substrate 122 having first and second surfaces 122a and 122b facing each other, and the third electrode 124, the second organic light emitting layer 126, the fourth electrode 128, and the dielectric mirror 113, which are sequentially stacked on the first surface 122a of the second substrate 122.

The fourth electrode 128 may be formed of a transmission electrode. For example, the fourth electrode 128 may include Ag, Al, Mg, Mo, or an alloy thereof. The dielectric mirror 113 is a semi-transmission layer provided as a semi-transmission mirror, where a low refractive index material and a high refractive index material are stacked alternately. The second device 120 may have a cavity structure L12 including the third electrode 124, the second organic light emitting layer 126, the fourth electrode 128, and the dielectric mirror 113 as a reflex mirror.

One of the first and second lights emitted from the first and second organic light emitting layers 116 and 126 may resonate between the third electrode 124 as a semi-transmission mirror and the dielectric mirror 113 as a reflex mirror. The resonance is provided at the geometric distance t6 from the third electrode 124 to the dielectric mirror 113. The geometric distance t6 may be adjusted according to an optical distance that optical resonance may occur. The optical distance from the third electrode 124 to the dielectric mirror 113 is equal to the sum of optical thicknesses of layers interposed between the third electrode 124 and the dielectric mirror 113. That is, the optical distance is equal to the sum of an optical thickness of the second organic light emitting layer 126 and an optical thickness of the fourth electrode 128. At this point, if a peak wavelength of a specific light that resonance occurs is λ, an optical distance may be an integer times of λ/2.

Except that the resonance occurs between the third electrode 124 and the dielectric mirror 113, an actual resonance principle is the same as the thirteenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 16:
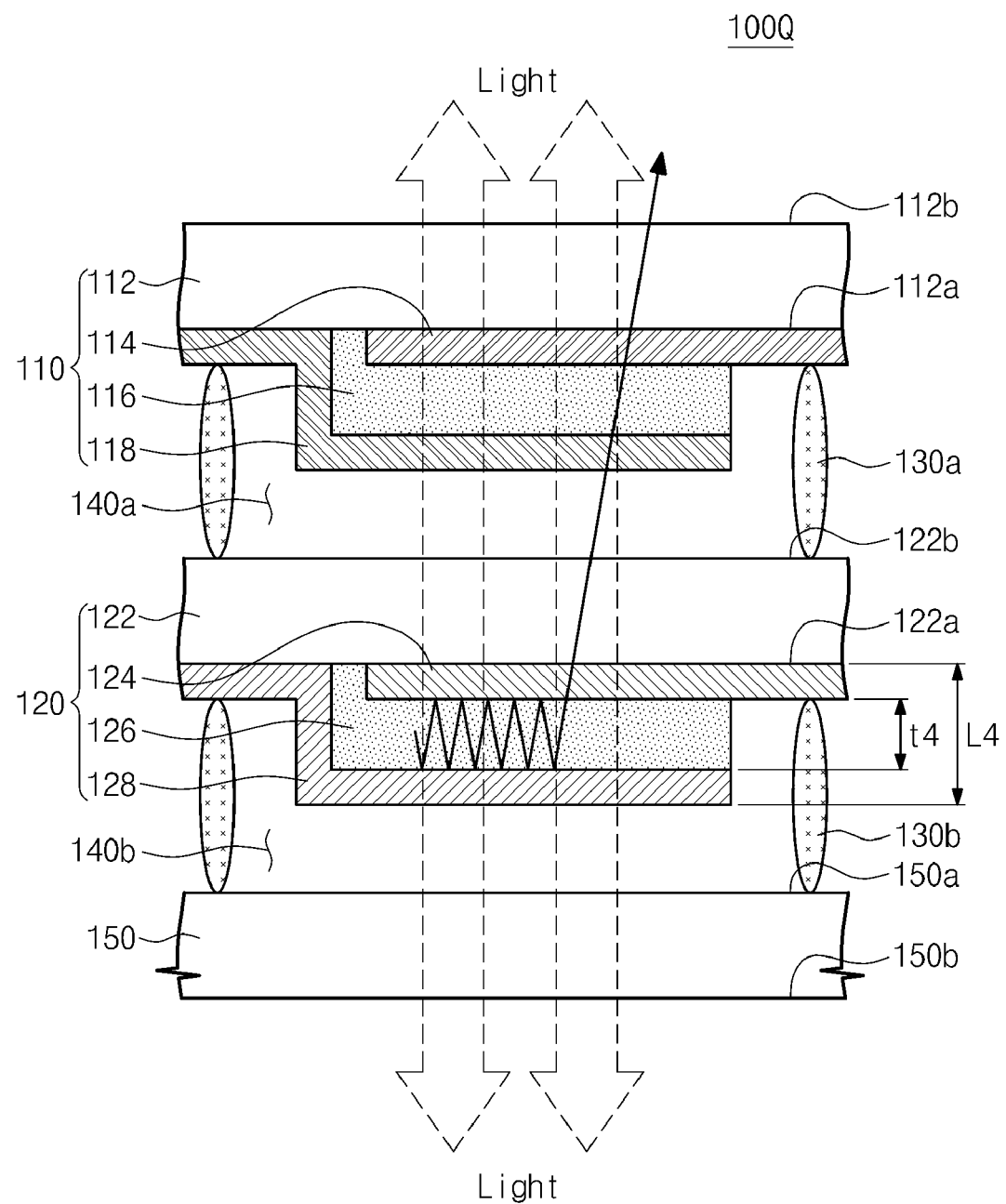

Hereinafter, the sixteenth embodiment will be described with reference to FIG. 16. In relation to an organic electroluminescence device 100Q according to the sixteenth embodiment of the present invention, except that the second device 120 is a both sides light emitting type and a material used for forming the sealing material 150 is different, the remaining components are identical to those of the thirteenth embodiment. Accordingly, overlapping description will be omitted and only differences will be described.

The fourth electrode 128 is a semi-transmission layer provided as a semi-transmission mirror may be formed of a metal having a thickness of less than 25 nm to transmit a part of light. Here, the metal may include Ag, Al, Mg, Mo, or an alloy thereof.

The sealing material 150 may be formed of a transparent material. For example, the sealing material may be formed of glass.

The second device 120 having the above structure corresponds to a both sides light emitting type that the second light emitted from the second organic light emitting layer 126 is extracted in the front and rear directions of the second substrate 122 and has a cavity structure L4 including the third electrode 124 as a semi-transmission mirror, the second organic light emitting layer 126, and the fourth electrode 128 as a semi-transmission mirror. Therefore, the organic electroluminescence device 100Q having the bonded first device 110 of a both sides light emitting type and second device 120 of a both sides light emitting type is completed.

One of the first and second lights emitted from the first and second organic light emitting layers 116 and 126 may resonate between the third electrode 124 and the fourth electrode 128 as semi-transmission mirrors. The resonance is provided at the geometric distance t4 from the third electrode 124 to the fourth electrode 128. The geometric distance t4 may be adjusted according to an optical distance that optical resonance may occur. The optical distance from the third electrode 124 to the fourth electrode 128 is equal to an optical thickness of the second organic light emitting layer 126. At this point, if a peak wavelength of a specific light that resonance occurs is λ, an optical distance may be an integer times of λ/2.

Except that the resonance occurs between the third electrode 124 and the fourth electrode 128, an actual resonance principle is the same as the thirteenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

When voltages is applied to the first and second electrodes 114 and 118 and the third and fourth electrodes 124 and 128 of the organic electroluminescence device 100Q, the first organic light emitting layer 116 emits the first light and the second organic light emitting layer 126 emits the second light. The first and second lights emitted from the first and second organic light emitting layers 116 and 126 are extracted to the external through the second surface 112*b* of the first substrate 112 and the second surface 150*b* of the sealing material 150. As a result, light emitted from the organic electroluminescence device 100Q is finally emitted as white light by complementary color combination of the first light emitted from the first organic light emitting layer 116 and the second light emitted from the second organic light emitting layer 126.

Figure 17:
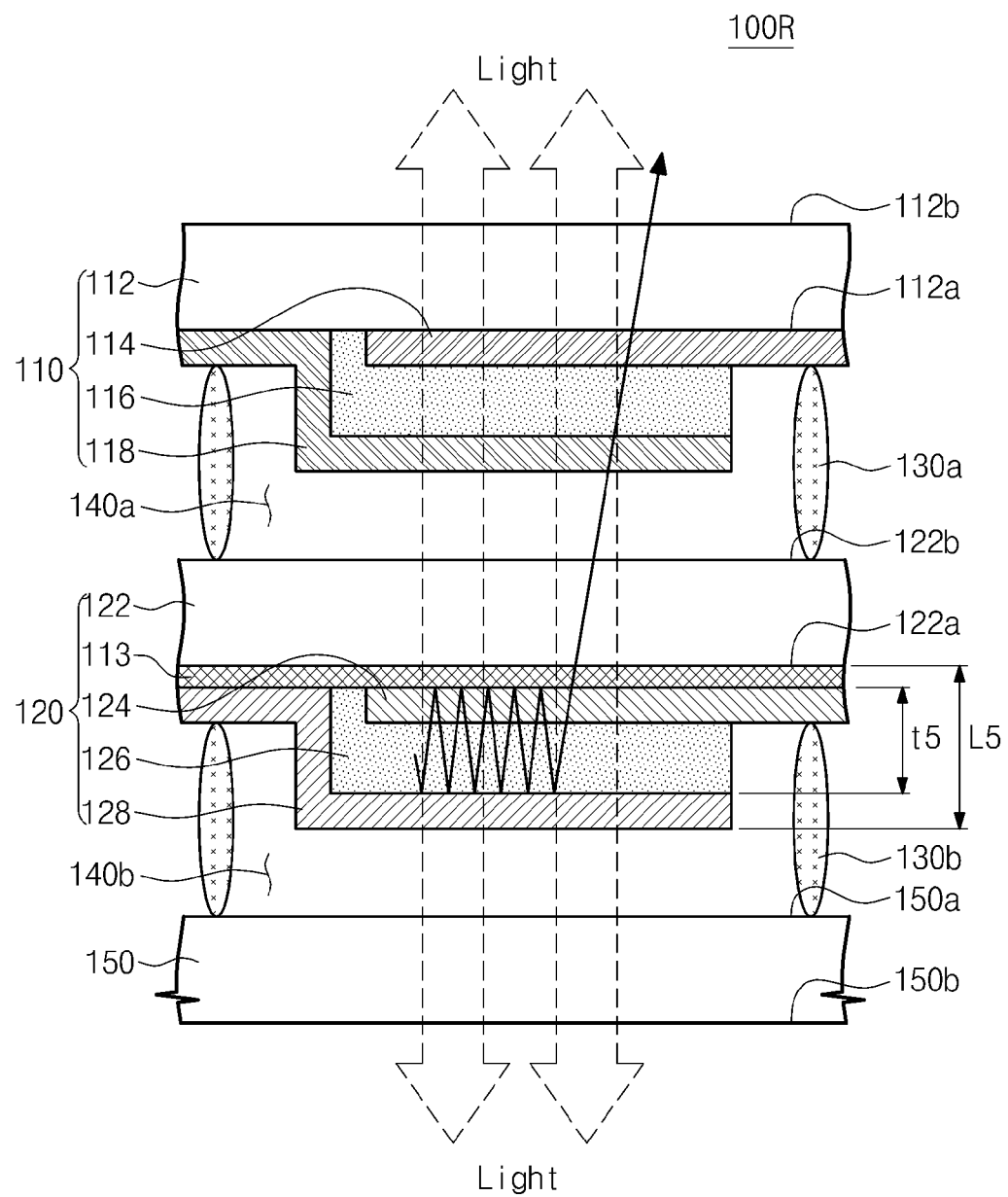

Hereinafter, referring to FIG. 17, the seventeenth embodiment of the present invention will be described. Except that an organic electroluminescence device 100R according to the seventeenth embodiment of the present invention further includes a dielectric mirror 113 between the second substrate 122 and the third electrode 124 and the third electrode 124 is formed of a transmission electrode, the remaining components are identical to those of the sixteenth embodiment. Accordingly, overlapping description will be omitted and only differences will be described.

The second device 120 may include a second substrate 122 having first and second surfaces 122*a* and 122*b* facing each other, and the dielectric mirror 113, the third electrode 124, the second organic light emitting layer 126, and the fourth electrode 128, which are sequentially stacked on the first surface 122*a* of the second substrate 122.

The dielectric mirror 113 is a semi-transmission layer provided as a semi-transmission mirror, where a low refractive index material and a high refractive index material are stacked alternately. The third electrode 124 may include a transmission electrode. For example, the third electrode 124 may include ITO or IZO. The second device 120 may have a cavity structure L5 including the dielectric mirror 113 as a semi-transmission mirror, the third electrode 124, the second organic light emitting layer 126, and the fourth electrode 118 as a reflex mirror.

One of the first and second lights emitted from the first and second organic light emitting layers 116 and 126 may resonate between the dielectric mirror 113 and the fourth electrode 128 as semi-transmission mirrors. The resonance is provided at the geometric distance t5 from the dielectric mirror 113 to the fourth electrode 128. The geometric distance t5 may be adjusted according to an optical distance that optical resonance may occur. The optical distance from the dielectric mirror 113 to the fourth electrode 128 is equal to the sum of an optical thickness of the third electrode 124 and an optical thickness of the second organic light emitting layer 126. At this point, if a peak wavelength of a specific light that resonance occurs is λ, an optical distance may be an integer times of λ/2.

Except that the resonance occurs between the dielectric mirror 113 and the fourth electrode 128, an actual resonance principle is the same as the sixteenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

Figure 18:
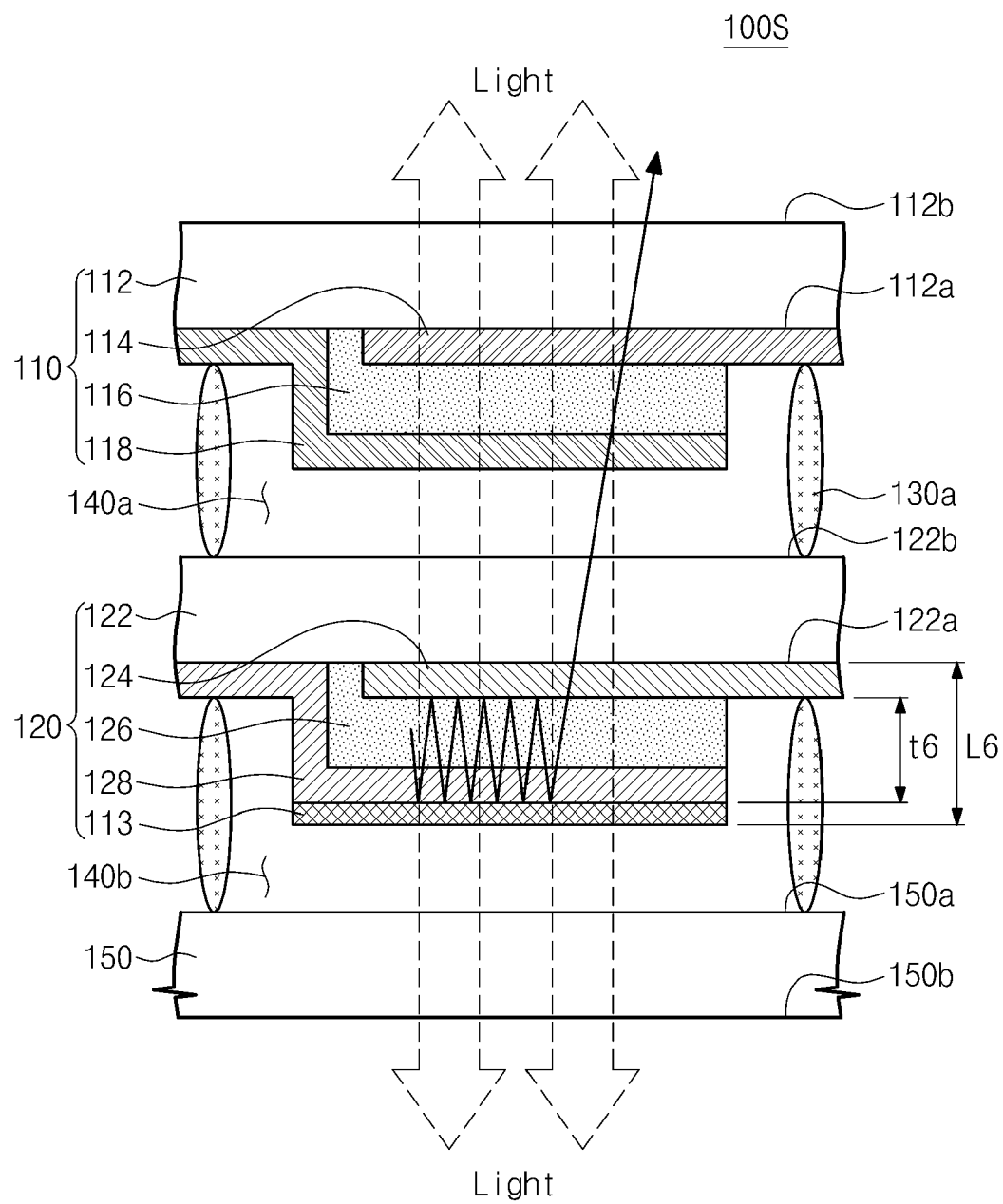

Hereinafter, the eighteenth embodiment will be described with reference to FIG. 18. Except that an organic electroluminescence device 100S according to the eighteenth embodiment of the present invention further includes a dielectric mirror 113 on the top of the fourth electrode 128 of the second device 120 and the fourth electrode 128 is formed of a transmission electrode, the remaining components are identical to those of the sixteenth embodiment. Accordingly, overlapping description will be omitted and only differences will be described.

The second device 120 may include a second substrate 122 having first and second surfaces 122*a* and 122*b* facing each other, and the third electrode 124, the second organic light emitting layer 126, the fourth electrode 128, and the dielectric mirror 113, which are sequentially stacked on the first surface 122*a* of the second substrate 122.

The fourth electrode 128 may be formed of a transmission electrode. For example, the fourth electrode 128 may include Ag, Al, Mg, Mo, or an alloy thereof. The dielectric mirror 113 is a semi-transmission layer provided as a semi-transmission mirror, where a low refractive index material and a high refractive index material are stacked alternately. The second device 120 may have a cavity structure L6 including the third electrode 124 as a semi-transmission mirror, the second organic light emitting layer 126, the fourth electrode 128, and the dielectric mirror 113 as a reflex mirror.

One of the first and second lights emitted from the first and second organic light emitting layers 116 and 126 may resonate between the third electrode 124 and the dielectric mirror 113 as semi-transmission mirrors. The resonance is provided at the geometric distance t6 from the third electrode 124 to the dielectric mirror 113. The geometric distance t6 may be adjusted according to an optical distance that optical resonance may occur. The optical distance from the third electrode 124 to the dielectric mirror 113 is equal to the sum of an optical thickness of the second organic light emitting layer 126 and an optical thickness of the fourth electrode 128. At this point, if a peak wavelength of a specific light that resonance occurs is $\lambda$, an optical distance may be an integer times of $\lambda/2$.

Except that the resonance occurs between the third electrode 124 and the dielectric mirror 113, an actual resonance principle is the same as the sixteenth embodiment. Accordingly, constructive interference of the first light emitted from the first organic light emitting layer 116 or the second light emitted from the second organic light emitting layer 126 occurs, and as a result, the light of an enhanced specific wavelength may be obtained.

As mentioned above, according to the second to eighteenth embodiments of the present invention, by using resonance of light with adopted cavity structure of one the bonded first and second devices 110 and 120, the light of an enhanced specific wavelength with respect to the first and second lights emitted from the first and second organic light emitting layers 116 and 126 may be obtained like the first embodiment, such that the same effect as the first embodiment may be obtained.

The organic electroluminescence device according to the first to eighteenth embodiments is not limited to a backlight of a liquid crystal display device and thus may be diversely applicable to a room lamp of a car or a lightening device of an interior wall.

Hereinafter, with reference to the embodiments of the present invention, light intensity and external quantum efficiency of the present invention will be described.

FIRST EXPERIMENTAL EXAMPLE

An organic electroluminescence device with a cavity structure is manufactured, after an anode of an ITO(50 nm)/Ag(10 nm)/ITO(50 nm) layered structure is formed, NPB(90 nm)/TcTa(10 nm) is sequentially and thermally deposited on the anode as a hole layer, a thin layer of 30 nm thickness is formed as a light emitting layer by doping a GDPH2 dopant of 5% into a SHO3 host produced by SFC, a thin layer of 30 nm thickness is formed as an electron layer by depositing ET137 produced by SFC, and a cathode of a LiF(1 nm)/Al(100 nm) layered structure is formed on the electron layer.

An organic electroluminescence device without a cavity structure is manufactured, after an anode of ITO(70 nm) is formed, NPB(90 nm)/TcTa(10 nm) is sequentially and thermally deposited on the anode as a hole layer, a thin layer of 30 nm thickness is formed as a light emitting layer by doping a GDPH2 dopant of 5% into a SHO3 host produced by SFC, a thin layer of 30 nm thickness is formed as an electron layer by depositing ET137 produced by SFC, and a cathode of a LiF(1 nm)/Al(100 nm) layered structure is formed on the electron layer.

Figure 19A:
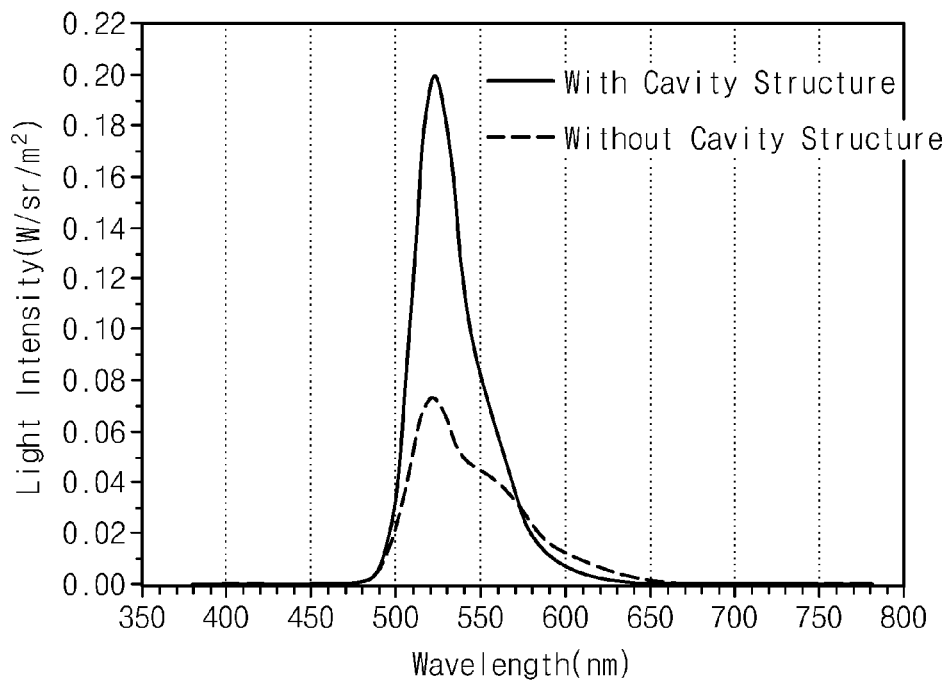
FIGS. 19A and 19B are graphs illustrating electroluminescent spectrum and luminance vs. external quantum efficiency characteristics of an organic electroluminescence device according to the presence of a cavity structure of the first experimental example of the present invention.
Figure 19B:
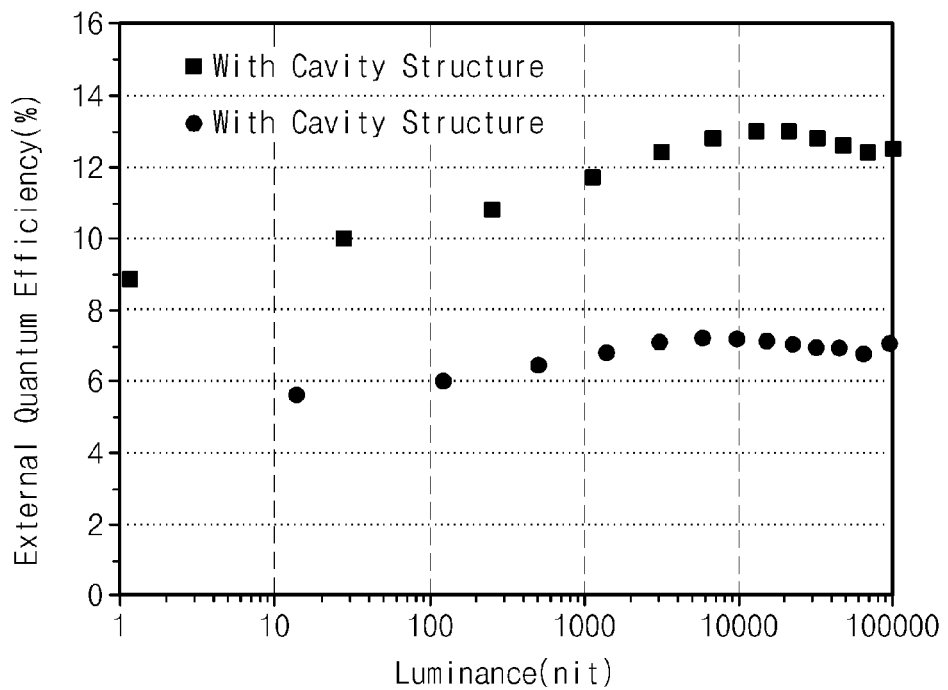

FIGS. 19A and 19B are graphs illustrating electroluminescent spectrum and radiance vs. external quantum efficiency characteristics of an organic electroluminescence device according to the presence of a cavity structure of the first experimental example of the present invention.

As shown in FIG. 19A, it is confirmed that the organic electroluminescence device with a cavity structure has radiance which is increased by about 2.4 times and full width at half maximum is narrowed compared to the organic electroluminescence device without a cavity structure. Additionally, as shown in FIG. 19B, the organic electroluminescence device with a cavity structure has improved external quantum efficiency which is about two times compared to the organic electroluminescence device without a cavity structure.

SECOND EXPERIMENTAL EXAMPLE

A transparent organic electroluminescence device with a cavity structure is manufactured, after an anode of an ITO(50 nm)/Ag(10 nm)/ITO(50 nm) layered structure is formed, NPB(90 nm)/TcTa(10 nm) is sequentially and thermally deposited on the anode as a hole layer, a thin layer of 30 nm thickness is formed as a light emitting layer by doping a GDPH2 dopant of 5% into a SHO3 host produced by SFC, a thin layer of 30 nm thickness is formed as an electron layer by depositing ET137 produced by SFC, a cathode of a LiF(1 nm)/Al(100 nm) layered structure is formed on the electron layer, and a sealing layer is formed by depositing NPB(50 nm) on the cathode.

A transparent organic electroluminescence device without a cavity structure is manufactured, after an anode of ITO(70 nm) is formed, NPB(90 nm)/TcTa(10 nm) is sequentially and thermally deposited on the anode as a hole layer, a thin layer of 30 nm thickness is formed as a light emitting layer by doping a GDPH2 dopant of 5% into a SHO3 host produced by SFC, a thin layer of 30 nm thickness is formed as an electron layer by depositing ET137 produced by SFC, a cathode of a LiF(1 nm)/Al(100 nm) layered structure is formed on the electron layer, and a sealing layer is formed by depositing NPB(50 nm) on the cathode.

Figure 20A:
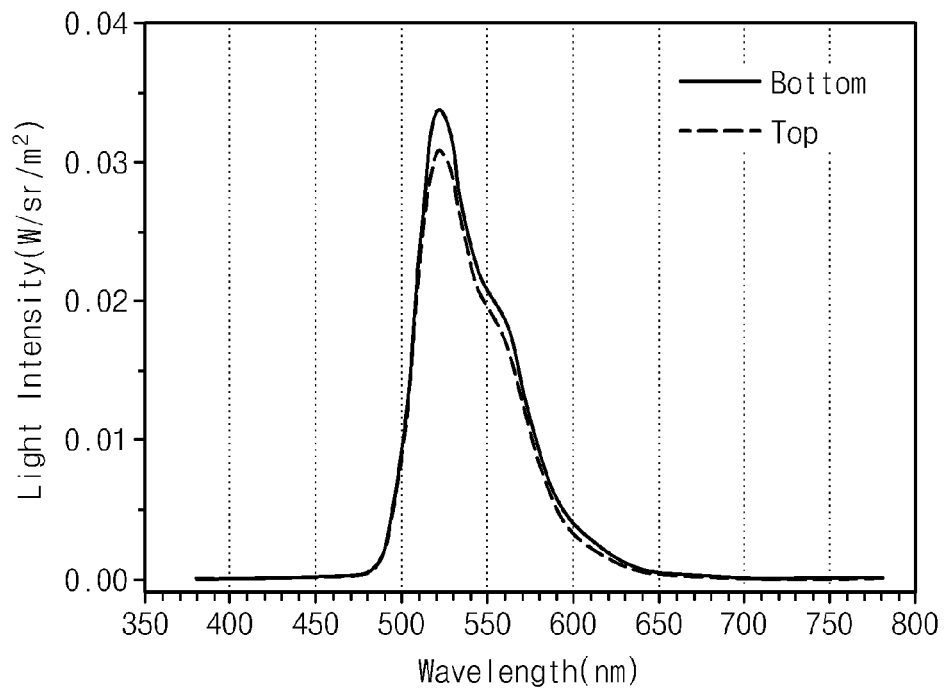
FIGS. 20A and 20B are graphs illustrating electroluminescent spectrum and luminance vs. external quantum efficiency characteristics of a transparent organic electroluminescence device with a cavity structure of the second experimental example of the present invention.
Figure 20B:
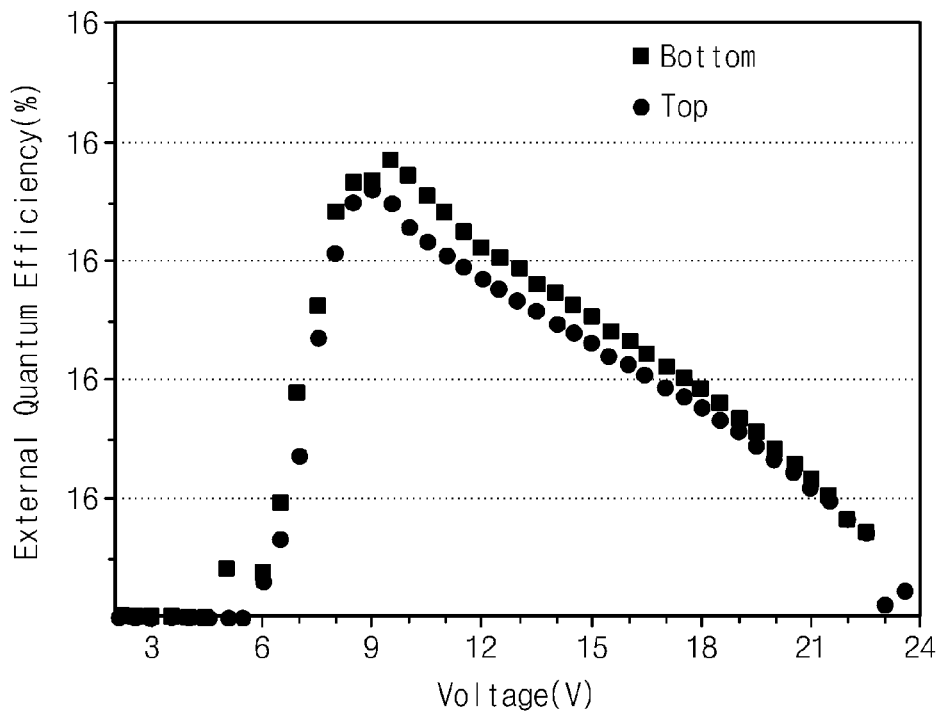
Figure 21A:
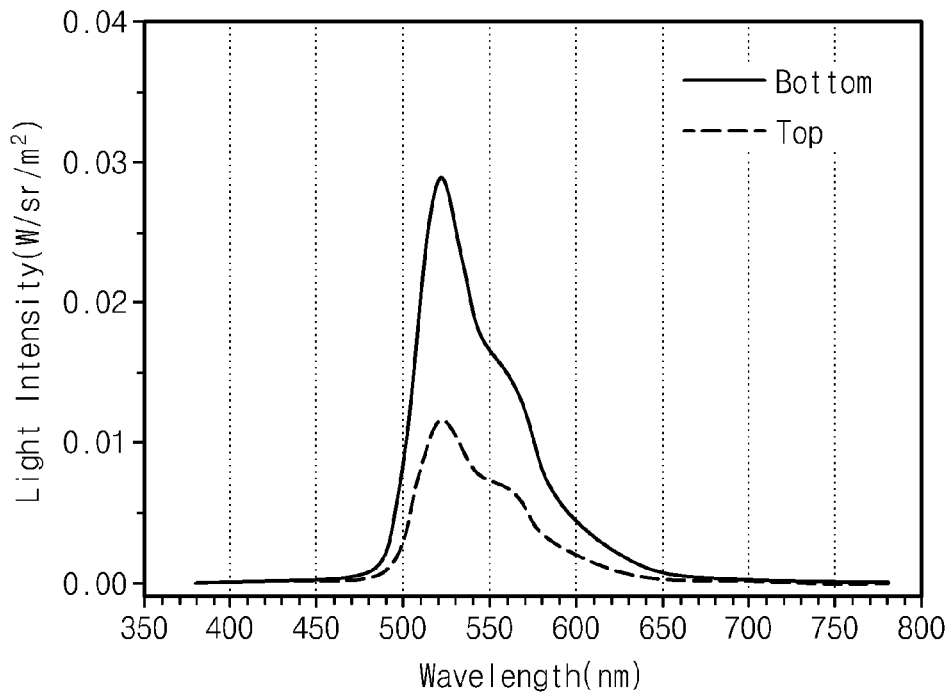
FIGS. 21A and 21B are graphs illustrating electroluminescent spectrum and luminance vs. external quantum efficiency characteristics of a transparent organic electroluminescence device without a cavity structure of the second experimental example of the present invention.
Figure 21B:
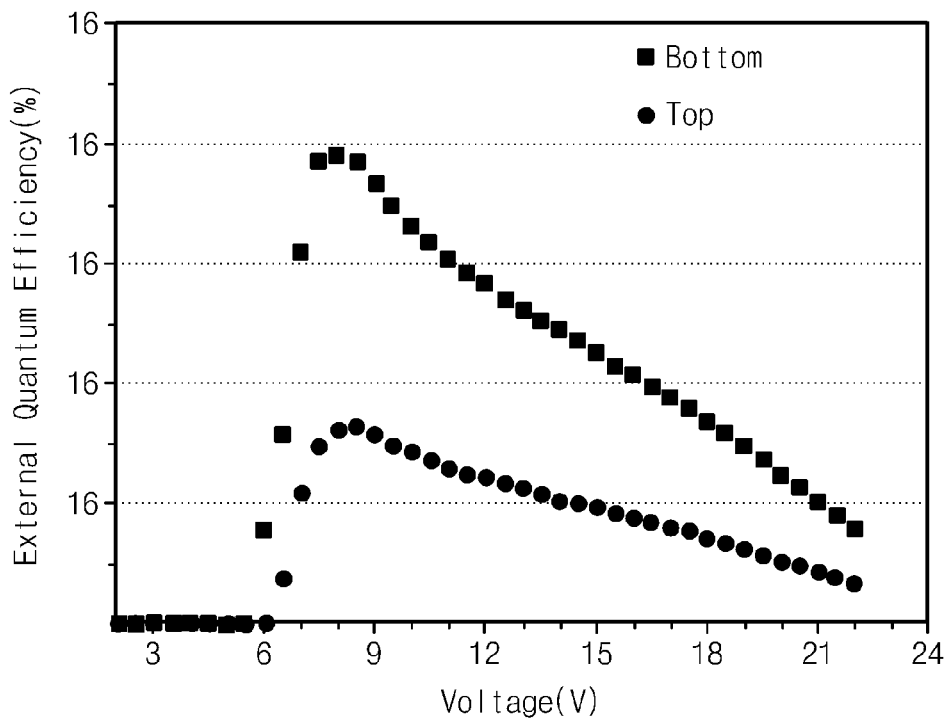

FIGS. 20A and 20B are graphs illustrating electroluminescent spectrum and radiance vs. external quantum efficiency characteristics of a transparent organic electroluminescence device according to the presence of a cavity structure of the second experimental example of the present invention. FIGS. 21A and 21B are graphs illustrating electroluminescent spectrum and radiance vs. external quantum efficiency characteristics of a transparent organic electroluminescence device without a cavity structure of the second experimental example of the present invention.

As shown in FIGS. 20A and 21A, it is confirmed that the transparent organic electroluminescence device with a cavity structure has top radiance which is increased by about 3 times and full width at half maximum at the top and bottom is narrowed compared to the transparent organic electroluminescence device without a cavity structure. Additionally, as shown in FIGS. 20B and 21B, the transparent organic electroluminescence device with a cavity structure has improved external quantum efficiency which is about 1.4 times compared to an organic electroluminescence device without a cavity structure.

THIRD EXPERIMENTAL EXAMPLE

A transparent organic electroluminescence device with a cavity structure is simulated with a structure of ITO(50 nm)/

Ag(10 nm)/ITO(50 nm)/NPB(120 nm)/SHO3:GDPH2(30 nm)/ET137(30 nm)/LiF(1 nm)/Al(1 nm)/Ag(15 nm)/NPB (50 nm).

A transparent organic electroluminescence device without a cavity structure is simulated with a structure of ITO(70 nm)/NPB(120 nm)/SHO3:GDPH2(30 nm)/ET137(30 nm)/ LiF(1 nm)/Al(1 nm)/Ag(15 nm)/NPB(50 nm).

Figure 22:
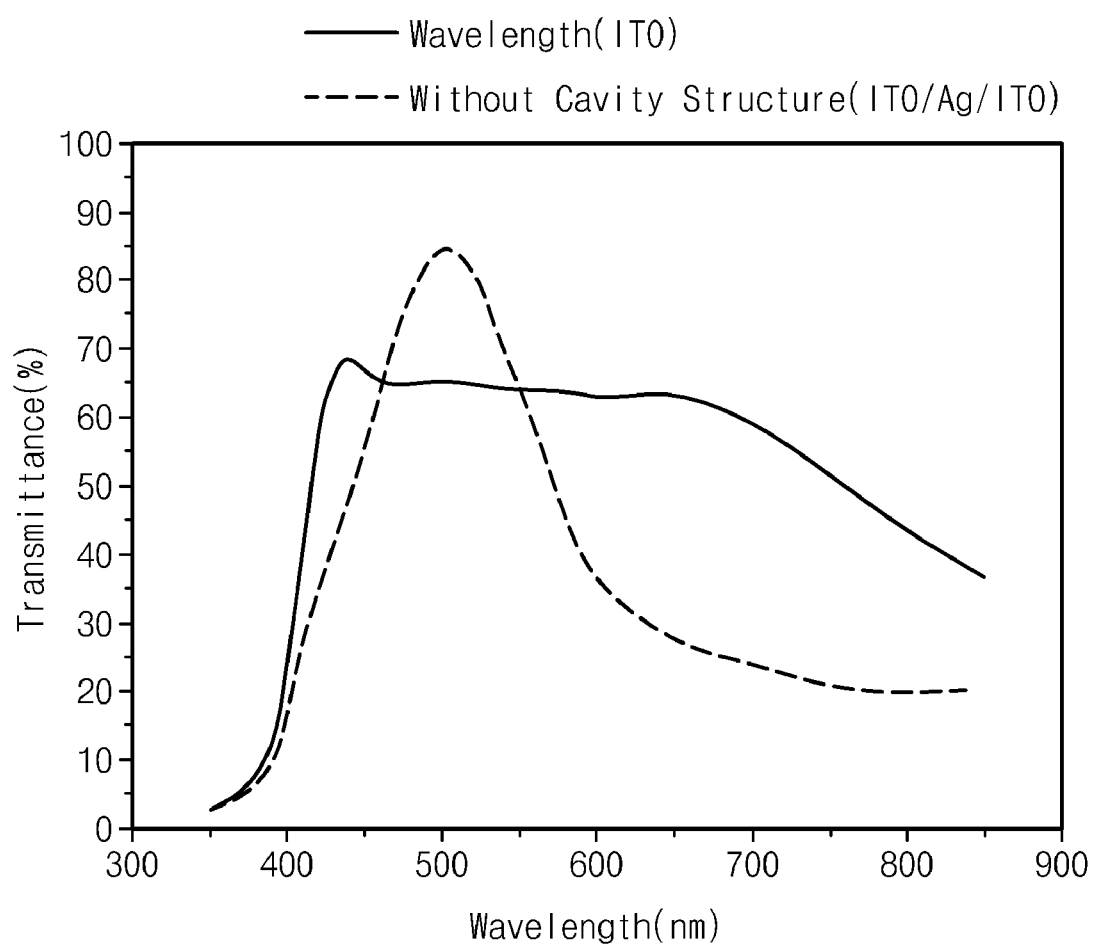
FIG. 22 is a simulation graph of a transmittance of a transparent organic electroluminescence device according to the presence of a cavity structure of the third experimental example.

FIG. 22 is a simulation graph of a transmittance of a transparent organic electroluminescence device according to the presence of a cavity structure of the third experimental example.

As shown in FIG. 22, it is confirmed that the transparent organic electroluminescence device with a cavity structure has a high transmittance at a specific wavelength of improved luminous efficiency and has less than a half transmittance at the remaining wavelengths. On the contrary, it is confirmed that the transparent organic electroluminescence device without a cavity structure has uniform high transmittance over an entire visible light range. Accordingly, if the transparent organic electroluminescence device with a cavity structure is bonded with a sectional organic electroluminescence device with a cavity structure having a different emitted color, since the transmittance of the transparent organic electroluminescence device is lowered at the emitted color of the sectional organic electroluminescence device, efficiency increased by resonance effect is reduced again. Referring to FIGS. 19A, 19B, and 22, it may be advantageous to efficiency improvement when the transparent organic electroluminescence device without a cavity structure is bonded to a sectional organic electroluminescence device with a cavity structure.

FOURTH EXPERIMENTAL EXAMPLE

In a transparent organic electroluminescence device with a cavity structure, electroluminescent spectrum is simulated with a structure of ITO(50 nm)/Ag(10 nm)/ITO(50 nm)/NPB (150 nm)/CBP(30 nm)/BCP(50 nm)/LiF(1 nm)/Al(100 nm). Luminescence spectrum is put with combination of greed and red.

In a sectional organic electroluminescence device without a cavity structure, electroluminescent spectrum is simulated with a structure of ITO(70 nm)/NPB(150 nm)/CBP(30 nm)/ BCP(50 nm)/LiF(1 nm)/Al(100 nm). Luminescence spectrum is put with combination of greed and red.

In a transparent organic electroluminescence device without a cavity structure, electroluminescent is simulated with a structure of ITO(70 nm)/NPB(120 nm)/SHO3:SD1(30 nm)/ ET137(30 nm)/LiF(1 nm)/Al(1.5 nm)/Ag(15 nm)/NPB(50 nm). Electroluminescent spectrum is simulated when the sectional organic electroluminescence device is bonded to the transparent organic electroluminescence device.

Figure 23A:
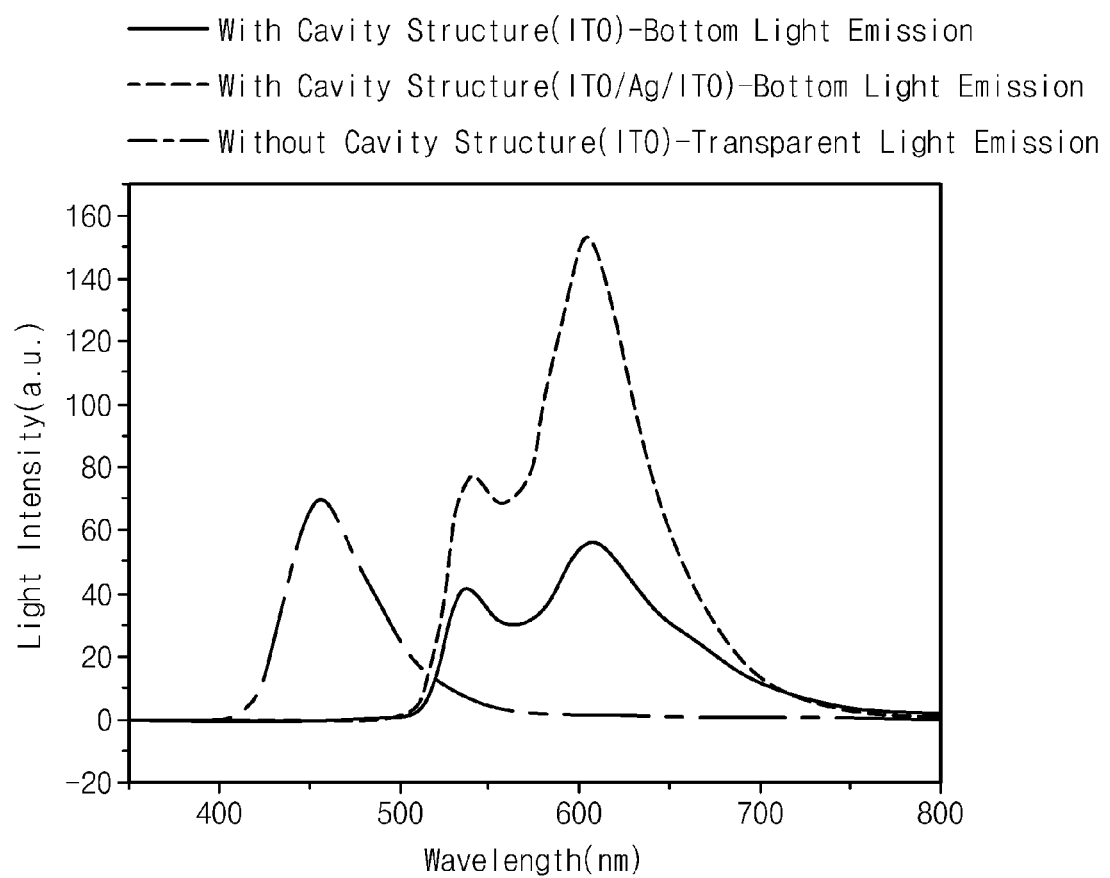
FIGS. 23A and 23B are simulation graphs of electroluminescent spectrum of a sectional organic electroluminescence device, and electroluminescent spectrum when a sectional organic electroluminescence device with/without a cavity structure is bonded with a transparent organic electroluminescence device without a cavity structure according to the presence of a cavity structure of the fourth embodiment of the present invention.
Figure 23B:
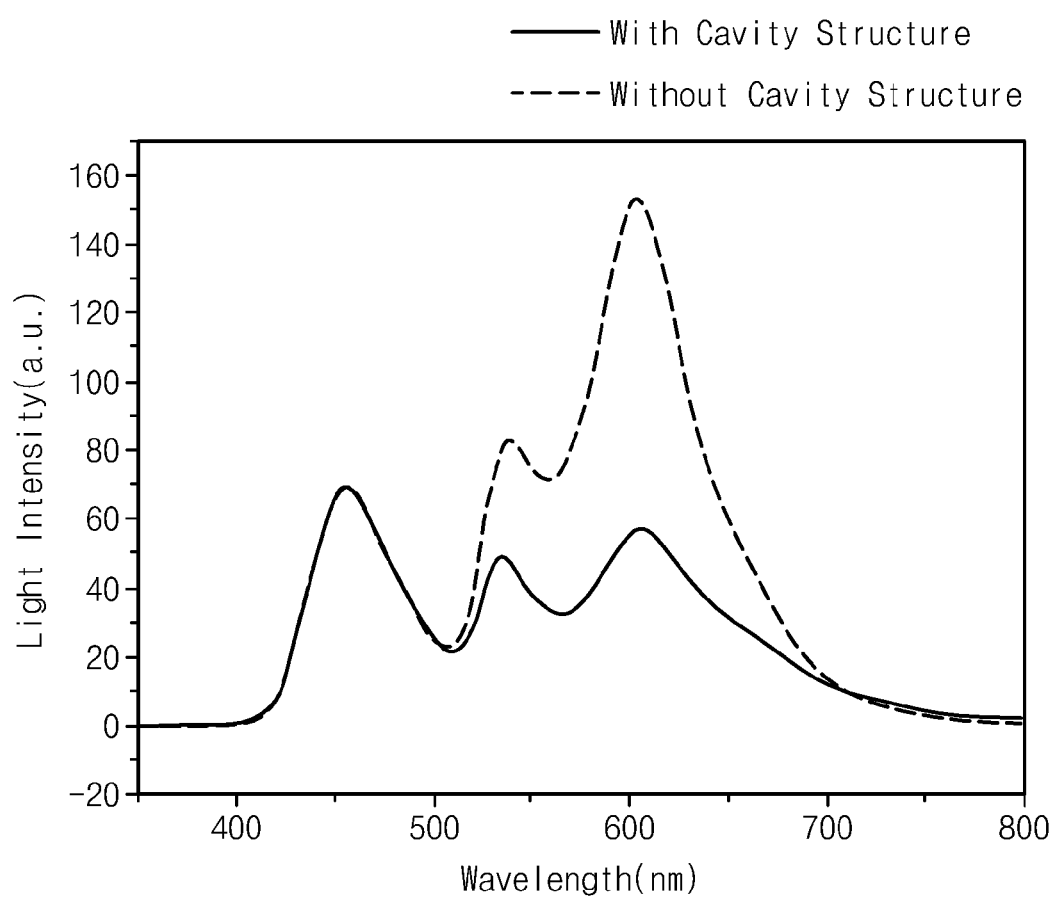

FIGS. 23A and 23B are simulation graphs of electroluminescent spectrum of a sectional organic electroluminescence device, and electroluminescent spectrum when a sectional organic electroluminescence device with/without a cavity structure is bonded with a transparent organic electroluminescence device without a cavity structure according to the presence of a cavity structure of the fourth embodiment of the present invention.

As shown in FIG. 23A, it is confirmed that the sectional organic electroluminescence device with a cavity structure has a light intensity that is two times high efficiency than the sectional organic electroluminescence device without a cavity structure. As shown in FIG. 23B, a bonding structure of the sectional organic electroluminescence device with a cavity structure and the transparent organic electroluminescence device without a cavity structure has a light intensity in a wavelength region of green and red that is more than two times high efficiency than a bonding structure of the sectional organic electroluminescence device without a cavity structure and the transparent organic electroluminescence device without a cavity structure, but due to the transparent organic electroluminescence device has no resonance effect in a blue region, light intensity change almost does not occur. If a green sectional organic electroluminescence device or a green/red sectional organic electroluminescence device is bonded with a transparent blue organic electroluminescence device, a while organic electroluminescence device may be manufactured. At this point, if a transparent blue organic electroluminescence device without resonance effect is bonded with a green/red sectional organic electroluminescence device with resonance effect, a more efficient white color device may be achieved.

According to embodiments of the present invention, an organic electroluminescence device with improved external quantum efficiency by using resonance of light in one of respectively boded two devices. Additionally, according to embodiments of the present invention, provided is an organic electroluminescence device with excellent reliability in high luminance. Moreover, according to embodiments of the present invention, emitted colors of a junction organic electroluminescence device is adjustable by adjusting luminance of two organic electroluminescence devices.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. An organic electroluminescence device comprising:
a first device including a first substrate, a first electrode, a first organic light emitting layer and a second electrode, the first electrode, the first organic light emitting layer and the second electrode being sequentially stacked on the first substrate;
a second device facing the first device and including a second substrate, a third electrode, a second organic light emitting layer and a fourth electrode, the third electrode, the second organic light emitting layer and the fourth electrode being sequentially stacked on the second substrate; and
a bonding layer bonding the first device with the second device,
wherein one of lights emitted from the first and second organic light emitting layers resonates in one of the first device or the second device.
2. The organic electroluminescence device of claim 1, wherein the second electrode faces the fourth electrode.
3. The organic electroluminescence device of claim 2, wherein one of the electrodes in one of the devices is a reflex mirror layer and the other is a semi-transmission mirror layer; and
the reflex mirror layer is the first electrode and the semi-transmission layer is the second electrode.
4. The organic electroluminescence device of claim 2, wherein the second electrode is a semi-transmission mirror layer and a dielectric mirror as a reflex mirror layer is further included between the first substrate and the first electrode, or the first electrode is a reflex mirror layer and a dielectric mirror as a semi-transmission mirror layer is further included on the top of the second electrode.

5. The organic electroluminescence device of claim 2, wherein the electrodes in one of the devices are semi-transmission mirror layers.

6. The organic electroluminescence device of claim 2, wherein one of the third electrode or the fourth electrode is a semi-transmission mirror layer and a dielectric mirror as a semi-transmission mirror layer is further included on the top of the fourth electrode or between the second substrate and the third electrode.

7. The organic electroluminescence device of claim 1, wherein the second electrode faces the second substrate.

8. The organic electroluminescence device of claim 7, wherein:
one of the electrodes in one of the devices is a reflex mirror layer and the other is a semi-transmission mirror layer; and
the reflex mirror layer is the first electrode and the semi-transmission mirror layer is the second electrode.

9. The organic electroluminescence device of claim 7, wherein:
one of the electrodes in one of the devices is a reflex mirror layer and the other is a semi-transmission mirror layer; and
the reflex mirror layer is the fourth electrode and the semi-transmission mirror layer is the third electrode.

10. The organic electroluminescence device of claim 7, wherein the electrodes in one of the devices are semi-transmission mirror layers.

11. The organic electroluminescence device of claim 7, wherein:
one of the second electrode or the third electrode is a semi-transmission mirror layer; and
a dielectric mirror as a reflex mirror layer is further included between the first substrate and the first electrode or on the top of the fourth electrode in the device including the second electrode or the third electrode.

12. The organic electroluminescence device of claim 7, wherein:
one of the first electrode or the fourth electrode is a reflex mirror layer; and
a dielectric mirror as a semi-transmission mirror layer is further included on the top of the second electrode or between the second substrate and the third electrode in the device including the first electrode or the fourth electrode.

13. The organic electroluminescence device of claim 7, wherein one of the first electrode, the second electrode, the third electrode or the fourth electrode is a semi-transmission mirror layer, and a dielectric mirror as a semi-transmission mirror layer is further included on the top of the second electrode, between the first substrate and the first electrode, on the top of the fourth electrode, or between the second substrate and the third electrode in the device including the first electrode, the second electrode, the third electrode, or the fourth electrode.

14. The organic electroluminescence device of claim 1, wherein a first light emitted from the first organic light emitting layer and a second light emitted from the second organic light are in a complementary color relationship.

15. The organic electroluminescence device of claim 14, wherein the first light and the second light are one of azure color light, red color light, blue color light, or orange color light.

16. The organic electroluminescence device of claim 15, wherein an optical distance between the electrodes in one of the devices is an integer times of a half-wavelength of one of the azure color light, the red color light, the blue color light, or the orange color light.

17. The organic electroluminescence device of claim 4, wherein an optical distance between the dielectric mirror and an electrode provided as one of the reflex mirror layer or the semi-transmission mirror layer in the device including the dielectric mirror is an integer times of a half-wavelength of one of lights emitted from the first and second organic light emitting layers.

18. The organic electroluminescence device of claim 17, wherein a first light emitted from the first organic light emitting layer and a second light emitted from the second organic light emitting layer are in a complementary color relationship.

19. The organic electroluminescence device of claim 18, wherein the first light and the second light are one of azure color light, red color light, blue color light, or orange color light.

* * * * *